US012520453B2

(12) United States Patent
Miura et al.

(10) Patent No.: US 12,520,453 B2
(45) Date of Patent: Jan. 6, 2026

(54) ELECTRICAL DEVICE AND CASE

(71) Applicant: DENSO CORPORATION, Kariya (JP)

(72) Inventors: Shinichi Miura, Kariya (JP); Kai Morimoto, Kariya (JP); Hitoshi Imura, Kariya (JP); Gyokuto Mo, Kariya (JP)

(73) Assignee: DENSO CORPORATION, Kariya (JP)

( * ) Notice: Subject to any disclaimer, the term of this patent is extended or adjusted under 35 U.S.C. 154(b) by 193 days.

(21) Appl. No.: 18/402,083

(22) Filed: Jan. 2, 2024

(65) Prior Publication Data

US 2024/0138109 A1 Apr. 25, 2024
US 2024/0237284 A9 Jul. 11, 2024

Related U.S. Application Data

(63) Continuation of application No. PCT/JP2022/022472, filed on Jun. 2, 2022.

(30) Foreign Application Priority Data

Jul. 5, 2021 (JP) ................................ 2021-111691

(51) Int. Cl.
*H05K 7/20* (2006.01)

(52) U.S. Cl.
CPC ..... *H05K 7/20272* (2013.01); *H05K 7/20927* (2013.01)

(58) Field of Classification Search
CPC .. H05K 7/20; H05K 7/20254; H05K 7/20263; H05K 7/20272; H05K 7/20336; H05K 7/20445; H05K 7/20854; H05K 7/20872; H05K 7/20927; H05K 5/02; H05K 5/0217; H05K 5/03; H05K 1/02; H01L 23/367; H01L 23/3672; H01L 23/473; H02M 7/537; H02M 3/00; H01F 27/025; H01F 27/10; F28D 15/00; G06F 1/20; G06F 2200/201
See application file for complete search history.

(56) References Cited

U.S. PATENT DOCUMENTS 8,342,276 B2 * 1/2013 Murakami .............. B60L 58/40
361/698
10,483,028 B2 * 11/2019 Roan ....................... H01F 27/10
2006/0272802 A1 12/2006 Sakayori et al.
2010/0296247 A1 11/2010 Chang et al.
2010/0326750 A1 * 12/2010 Murakami ............ H01L 25/072
165/185

(Continued)

FOREIGN PATENT DOCUMENTS

JP 2019-125716 A 7/2019

*Primary Examiner* — Amir A Jalali
(74) *Attorney, Agent, or Firm* — Oliff PLC

(57) ABSTRACT

An electrical device such as a power control apparatus comprises a case and at least one electrical component accommodated in the case. The case has a flow path for a cooling fluid. The flow path is formed between a bottom portion and a cover. The flow path is elongated generally along a U shape. The bottom portion and the cover are joined by welding. The cover is formed with protruding portions protruding into the flow path. The protruding portions have shapes to reduce stress concentration on welding portions. A stress caused by a pressure of the cooling fluid may acts on a distal end formed inside of the U shape in a concentration manner.

10 Claims, 12 Drawing Sheets

(56) References Cited

U.S. PATENT DOCUMENTS

| | | | | |
|---|---|---|---|---|
| 2013/0206371 | A1* | 8/2013 | Fujita | F28F 3/12<br>165/104.28 |
| 2014/0009890 | A1* | 1/2014 | Moon | H05K 9/0088<br>361/707 |
| 2017/0181333 | A1* | 6/2017 | Kosaka | H02M 7/003 |
| 2019/0150328 | A1* | 5/2019 | Miura | H05K 5/03<br>361/699 |
| 2020/0052612 | A1 | 2/2020 | Tsutsui et al. | |
| 2023/0247809 | A1* | 8/2023 | Miura | H05K 7/20927<br>361/699 |

* cited by examiner

ELECTRICAL DEVICE AND CASE

CROSS REFERENCE TO RELATED APPLICATIONS

The present application is a continuation application of International Patent Application No. PCT/JP2022/022472 filed on Jun. 2, 2022, which designated the U.S. and is based on and claims the benefit of priority from Japanese Patent Application No. 2021-111691 filed on Jul. 5, 2021, and all the contents of the application are incorporated by reference.

TECHNICAL FIELD

The disclosure herein relates to a case and an electrical device with the case.

BACKGROUND

An electrical device such as a power control apparatus comprises a case and at least one electrical component accommodated in the case. The case has a flow path for a cooling fluid. The flow path is formed between a bottom portion of a main body and a cover. The flow path is elongated along the cover. Therefore, a pressure of the cooling fluid acts on the cover and creates a mechanical stress on a joining portion. In the above aspects, or in other aspects not mentioned, there is a need for further improvements in a case and an electrical device with the case.

SUMMARY

The present disclosure provides a case and an electrical device with the case.

In the present disclosure, a case in which a flow path for a cooling fluid is formed, the case comprising:

a main body including a supply port through which the cooling fluid is supplied, a discharge port through which the cooling fluid is discharged, and a recessed portion recessed from a lower surface of a bottom portion to an upper surface of the bottom portion in an arrangement direction in which the lower surface and the upper surface are arranged to define a portion of the flow path and to connect the supply port and the discharge port; and a cover which has a first main surface joined to the lower surface to cover the recessed portion except for the supply port and the discharge port and forms the flow path from the supply port and the discharge port, wherein the cover is formed with an extension portion which is placed on a portion to define a part of the flow path, protrudes from a second main surface, which is a back surface of the first main surface, to the first main surface in the arrangement direction, and extends along an extension direction of the flow path, and wherein the extension portion is defined by an outer edge portion which includes a part extending along the flow path and a part extending in a width direction perpendicular to the extension direction, and wherein the extension portion is divided into a plurality of portions, and wherein the flow path includes:

a first flow path which is connected to the supply port at one end;

a third flow path which is arranged parallel to the first flow path in a lateral direction in which the supply port and the discharge port are arranged in parallel and is connected to the discharge port at one end; and a second flow path which extends from the first flow path to the third flow path in a turning manner and connects the other end of the first flow path and the other end of the third flow path, wherein the bottom portion includes:

a central wall portion which is surrounded by the flow path along a circumferential direction about the arrangement direction; and an outer peripheral wall portion which surrounds the flow path in the circumferential direction, wherein the cover is joined to the lower surface to cover the central wall portion, the flow path, and a part of the outer peripheral wall portion, and wherein at least two of the ends of the extension portion divided into a plurality of portions are provided in the second flow path, and wherein the central wall portion includes:

a first central wall portion on a side of both the supply port and the discharge port; and a second central wall portion on a side of the second flow path, wherein the maximum width in the lateral direction of the second central wall portion is larger than the maximum width in the lateral direction of the first central wall portion, and wherein the second central wall portion and the cover are joined in an annular shape along the second flow path.

According to the case, it is possible to suppress a deformation of the cover in an arrangement direction due to a pressure applied to the cover from a cooling fluid. Also, it is possible to protect joining ends in the width direction of the flow path. Further, the second central wall portion and the cover are joined in an annular shape along the second flow path. Therefore, it is possible to reduce stress concentration at a joining portion between the second central wall portion and the cover.

In the present disclosure, an electrical device comprises electrical components and a case which accommodates the electrical components in an internal space thereof, and a flow path through which a cooling fluid flows is formed in the case, the electrical device comprising:

the case includes:

a main body including a supply port through which the cooling fluid is supplied, a discharge port through which the cooling fluid is discharged, and a recessed portion recessed from a lower surface of a bottom portion to an upper surface of the bottom portion in an arrangement direction in which the lower surface and the upper surface are arranged to define a portion of the flow path and to connect the supply port and the discharge port; and a cover which has a first main surface joined to the lower surface to cover the recessed portion except for the supply port and the discharge port and forms the flow path from the supply port and the discharge port, wherein the cover is formed with an extension portion which is placed on a portion to define a part of the flow path, protrudes from a second main surface, which is a back surface of the first main surface, to the first main surface in the arrangement direction, and extends along an extension direction of the flow path, and wherein the extension portion is defined by an outer edge portion which includes a part extending along the flow path and a part extending in a width direction perpendicular to the extension direction, and wherein the extension portion is divided into a plurality of portions, and wherein the flow path includes:

a first flow path which is connected to the supply port at one end;

a third flow path which is arranged parallel to the first flow path in a lateral direction in which the supply port and the discharge port are arranged in parallel and is connected to the discharge port at one end; and a second flow path which extends from the first flow path to the third flow path in a turning manner and connects the other end of the first flow path and the other end of the third flow path, wherein the bottom portion includes:

a central wall portion which is surrounded by the flow path along a circumferential direction about the arrangement direction; and an outer peripheral wall portion which surrounds the flow path in the circumferential direction, wherein the cover is joined to the lower surface to cover the central wall portion, the flow path, and a part of the outer peripheral wall portion, and wherein at least two of the ends of the extension portion divided into a plurality of portions are provided in the second flow path, and wherein the central wall portion includes:

a first central wall portion on a side of both the supply port and the discharge port; and a second central wall portion on a side of the second flow path, wherein the maximum width in the lateral direction of the second central wall portion is larger than the maximum width in the lateral direction of the first central wall portion, and wherein the second central wall portion and the cover are joined in an annular shape along the second flow path.

According to the above electrical device, the same effects as the case can be achieved.

BRIEF DESCRIPTION OF DRAWINGS

The disclosure is further described with reference to the accompanying drawings in which.

DETAILED DESCRIPTION

Figure 1:
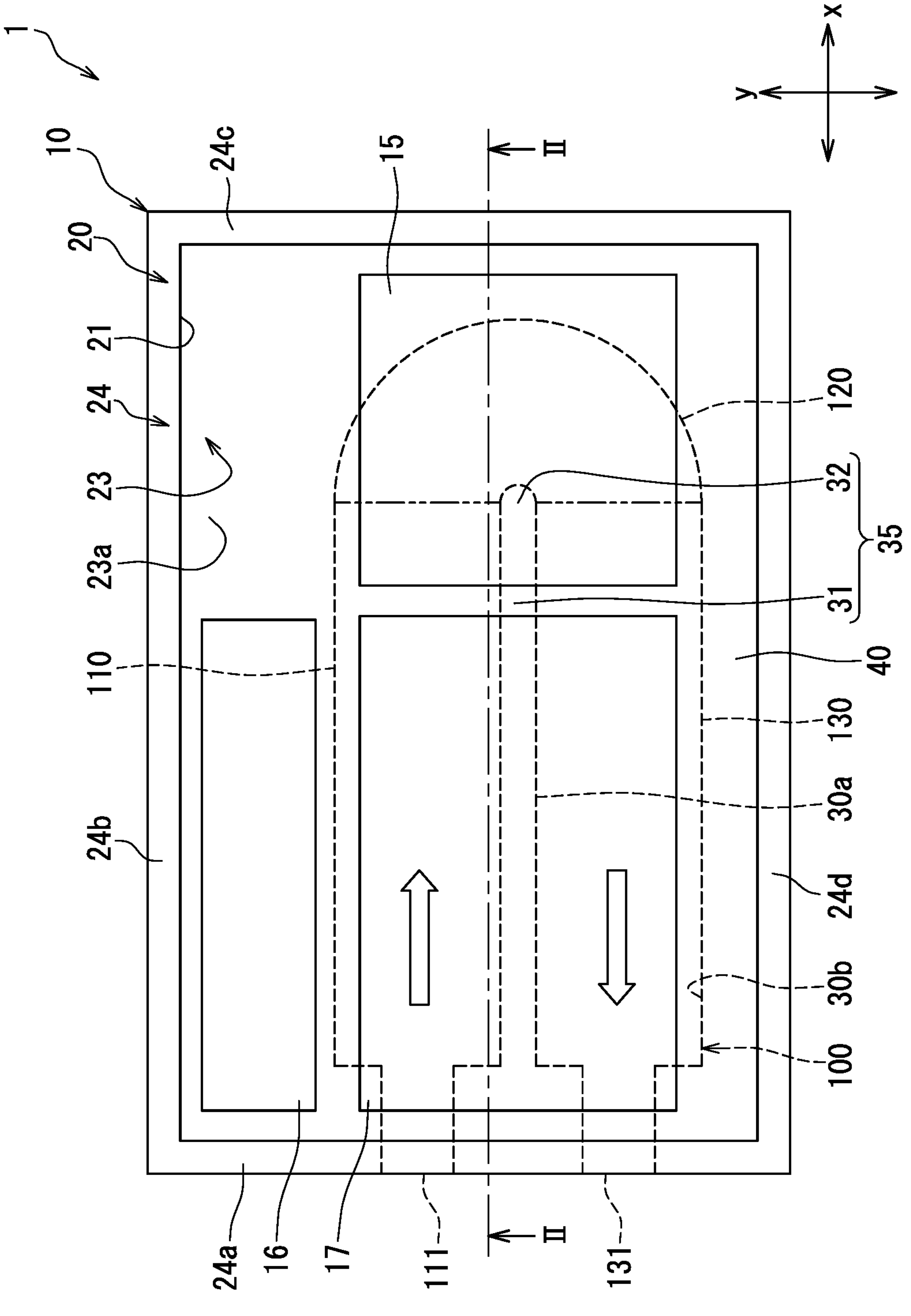
FIG. 1 is a plan view of a power control apparatus viewed from a side of an opening.

The following describe embodiments for carrying out the present disclosure with reference to the drawings. In each embodiment, parts corresponding to the elements described in the preceding embodiments are denoted by the same reference numerals, and redundant explanation may be omitted. When only a part of the configuration is described in each embodiment, another embodiment described previously may be applied to the other parts of the configuration.

It may be possible not only to combine parts the combination of which is explicitly described in an embodiment, but also to combine parts of respective embodiments the combination of which is not explicitly described if any obstacle does not especially occur in combining the parts of the respective embodiments.

JP 2019-125716A discloses a case having a flow path through which a cooling fluid flows. The case has a main body defining a flow path, which has side surfaces including an open top surface, and a cover, which covers the open top surface of the flow path.

The cover is joined to the main body so as to surround the flow path. The pressure applied to the cover from the cooling fluid may deform the cover in an arrangement direction in which the main body and the cover are arranged in a stacking manner. The deformation of the cover may break ends in a width direction of the flow path.

It is an object of the embodiment to provide a case and an electrical device in which a cover is prevented from deforming in an arrangement direction between the body and the cover with respect to a width direction of the flow path due to a pressure applied to the cover from a cooling fluid.

It is another object of the embodiment to provide a case and an electrical device in which a stress concentration is reduced at an inner joint portion which is located on an inside of a curve of the flow path formed between the body and the cover.

First Embodiment

The power control apparatus 1 shown in FIG. 1 is included in a drive system. The drive system is adapted to a vehicle such as an electric vehicle (EV), a hybrid vehicle (HV) and a fuel cell battery vehicle. In addition to the power control apparatus 1, the drive system includes an inverter device, batteries, and a motor. The drive system 10 is a system to drive the motor for driving the drive wheels of the vehicle.

The battery is a direct-current voltage source which includes a chargeable and dischargeable secondary battery. The secondary battery is, for example, a lithium ion battery or a nickel hydride battery. The drive system has a high voltage battery and a low voltage battery as the batteries. The voltage of the high voltage battery is, for example, 100V, and the voltage of the low voltage battery is, for example, 12V. The high voltage battery may be referred to as a first power source, and the low voltage battery may be referred to as a second power source.

The motor is a three-phase AC rotary electric machine. The motor has a U phase, a V phase, and a W phase as three phases. The motor functions as an electric machine that is a travel driving source of the vehicle. The motor functions as an electric generator during regeneration.

The inverter device performs power conversion between the high voltage battery and the motor. The inverter device is capable of bidirectional power conversion. The inverter device converts DC power from the high voltage battery into AC power and supplies the AC power to the motor. Further, the inverter device converts AC power generated by the motor into DC power and supplies the DC power to the high voltage battery. The inverter device includes an inverter circuit and a capacitor. The inverter circuit includes a plurality of semiconductor switches. The capacitor is, for example, a smoothing capacitor, and stabilizes the DC voltage supplied from the high voltage battery to the inverter circuit.

The power control apparatus 1 is a converter device. The power control apparatus 1 and the converter unit 15 described below may be referred to as a DCDC converter. The power control device 1 is capable of bidirectional power conversion. The power control apparatus 1 converts a DC voltage into a DC voltage of a different voltage. The power control apparatus 1 performs power conversion between a high voltage battery and a low voltage battery. The power control apparatus 1 steps down the DC voltage from the high voltage battery and supplies it to the low voltage battery. Further, the power control apparatus 1 performs power conversion between the inverter device and the low voltage battery. The power control apparatus 1 steps down the DC voltage from the inverter device and supplies it to the low voltage battery.

The power control apparatus 1 includes a converter circuit, the capacitor, and a reactor. The converter circuit includes a plurality of semiconductor switches. The capacitor is, for example, a filter capacitor, which removes power supply noise from the high voltage battery. The reactor boosts the voltage from the high voltage battery, e.g., in response to a switching operation of a semiconductor switch in the converter circuit. The power control apparatus 1 also includes a control device that controls a circuit of the converter device. The control device is composed of an ECU and the like. ECU is an abbreviation of Electronic Control Unit. Note that the control device may be included in the inverter device, or a common control device may be provided for the power control apparatus 1 and the inverter device.

Next, a structure of the power control apparatus 13 is described with reference to FIG. 1 and FIG. 2.

Figure 2:
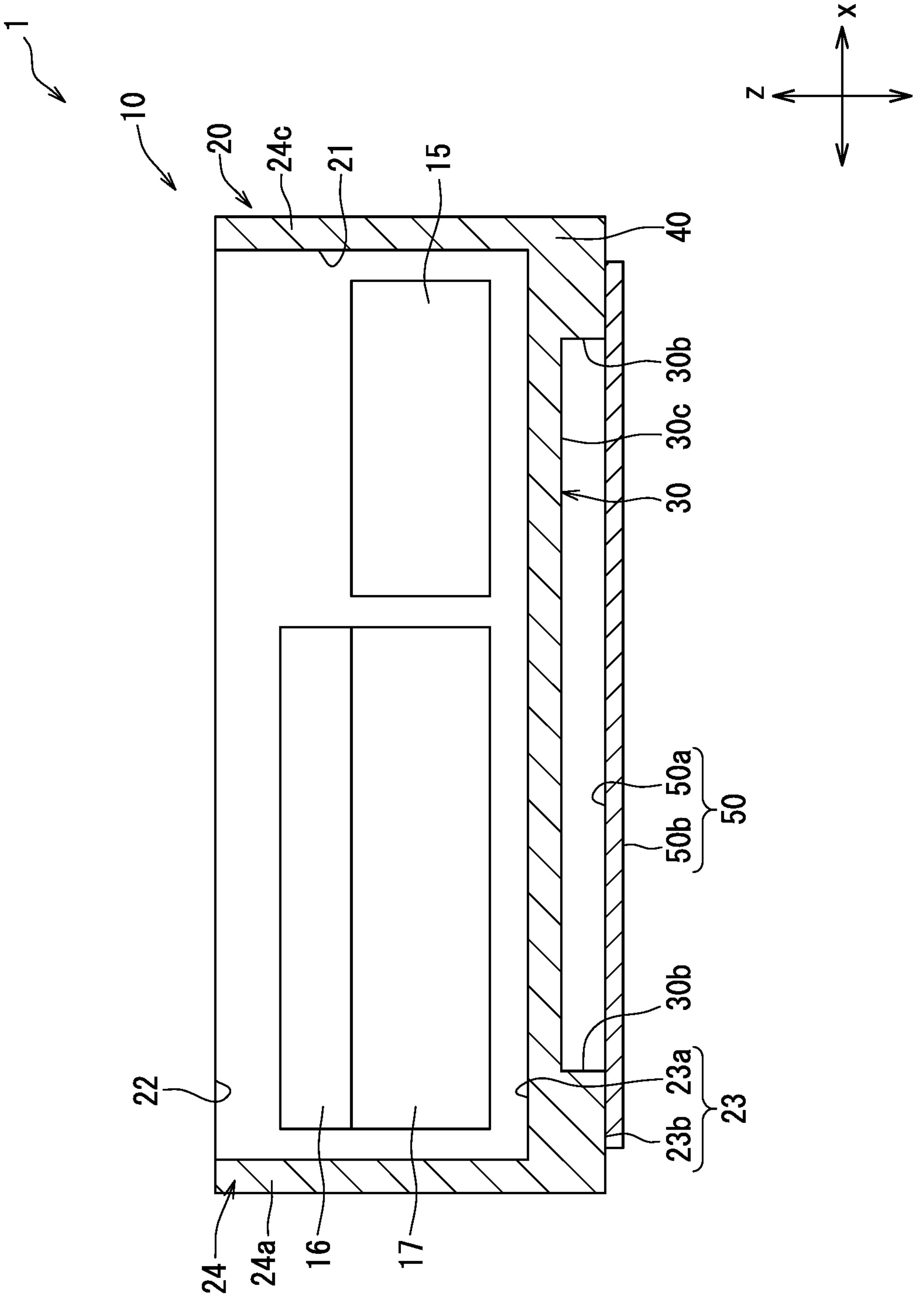
FIG. 2 is a cross-sectional view of the power control apparatus along a line II-II shown in FIG. 1.

As shown in FIGS. 1 and 2, the power control apparatus 1 includes a converter unit 15, a capacitor unit 16, a reactor unit 17, and a case 10 accommodating the above units 15, 16, and 17. The case 10 includes a main body 20 that houses the converter unit 15 to the reactor unit 17, and a cover 50 that is attached to the main body 20. The main body 20 and the cover 50 are explained later in details.

Note that the converter unit 15, the capacitor unit 16, and the reactor unit 17 correspond to electrical components. The power control apparatus 1 corresponds to an electrical device. The case 10 is sometimes referred to as a converter case.

Note that in FIG. 2, the converter unit 15 and the reactor unit 17 are shown in a side view, not in cross section.

The converter unit 15 includes a switching element that constitutes a semiconductor switch of the converter circuit, and a covering resin that protects the switching element. The capacitor unit 16 includes a capacitor element that constitutes a filter capacitor and a capacitor case that protects the capacitor element. The reactor unit 17 includes a reactor element that constitutes a reactor, and a reactor case that protects the reactor element.

<Mechanical Configuration of Power Control Apparatus>

A mechanical configuration of the power control apparatus 1 is described. Hereinafter, three directions orthogonal to each other are referred to as an x-direction, a y-direction, and a z-direction. Note that the horizontal direction corresponds to the y-direction. The z-direction corresponds to the arrangement direction. In the drawings, the word "direction" is omitted.

As shown in FIGS. 1 and 2, the main body 20 has a box shape. The main body 20 has a bottom portion 23 and side portions 24. As shown in FIG. 2, the bottom portion 23 has a flat shape with a thin thickness in the z-direction.

The bottom portion 23 has an upper surface 23*a* and a lower surface 23*b* on the back side thereof, which are formed parallel in the z-direction. Side portions 24 are connected to the upper surface 23*a*. The side portions 24 extends upwardly in an annular manner so as to extend away from the upper surface 23*a*. The side portions 24 has a first side portion 24*a* and a third side portion 24*c* that are parallel and spaced apart in the x-direction, and a second side portion 24*b* and a fourth side portion 24*d* that are parallel and spaced apart in the y-direction. An internal space 21 is defined by the side portions 24*a*, 24*b*, 24*c* and 24*d*. Further, an opening 22 that opens in the z-direction is formed by ends spaced apart from the upper surface 23*a* of the side portions 24*a*, 24*b*, 24*c* and 24*d*.

As shown in FIGS. 1 and 2, the converter unit 15, the capacitor unit 16, and the reactor unit 17 are accommodated in the internal space 21, respectively.

The capacitor unit 16 and the reactor unit 17 are placed on a side of the first side portion 24*a* in the internal space 21. The capacitor unit 16 and the reactor unit 17 are arranged in an arrangement manner so as to be spaced apart from each other in the y-direction. The capacitor unit 16 is placed on a side of the second side portion 24*b*. The reactor unit 17 is placed on a side of the fourth side portion 24*d*.

Further, the converter unit 15 is placed on a side of the third side portion 24*c* of the internal space 21. The converter unit 15 and the reactor unit 17 are arranged in an arrangement manner so as to be spaced apart from each other in the x-direction.

As shown in FIG. 2, a recessed portion 30 is formed in the bottom portion 23 and is recessed from the lower surface 23*b* toward the upper surface 23*a*. The recessed portion 30 defines a part of a flow path 100, which is described later. The recessed portion 30 is a depression for allowing the cooling fluid to flow into the main body 20. The recessed portion 30 is formed in a U shape in a plan view in the z-direction. The recessed portion 30 may be called a round trip arrangement or a turning shape.

Figure 3:
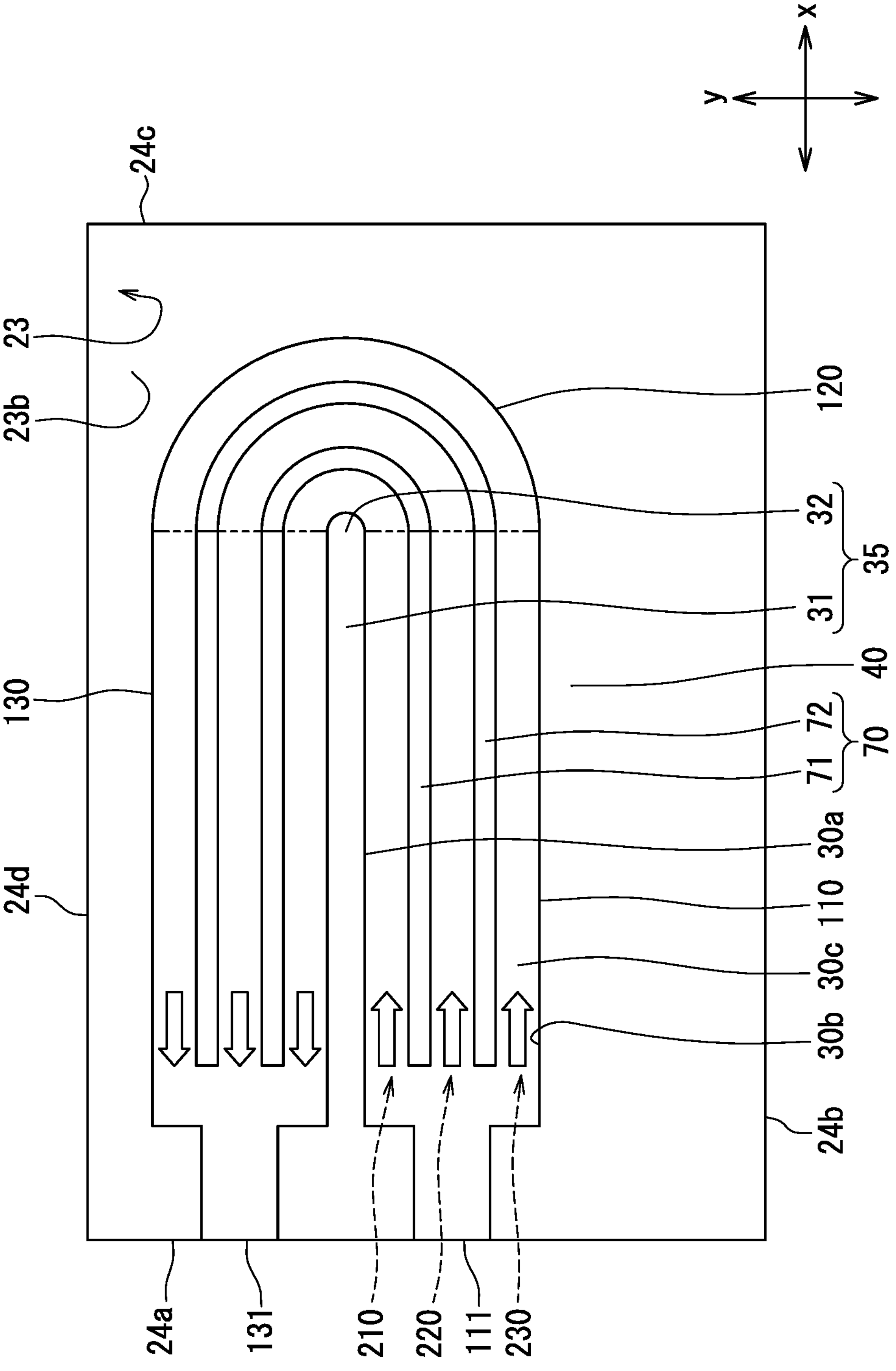
FIG. 3 is a plan view of a main body viewed from a side of a bottom.

As shown in FIGS. 1 to 3, the recessed portion 30 is defined with a first inner surface 30*a*, a second inner surface 30*b* and a third inner surface 30*c*. The first inner surface 30*a* and the second inner surface 30*b* are located opposite to each other in a with direction of the flow path 100. The first inner surface 30*a* and the second inner surface 30*b* extend in the z-direction to define a depth of the flow path 100 and extends along the bottom portion 23 to define a longitudinal length of the flow path 100, i.e., a flow length of the cooling fluid.

The second inner surface 30*b* is located on an outside of the flow path 100, i.e., on a side to the side portions 24 in the width direction of the flow path 100. The first inner surface 30*a* is located on an inside of the flow path 100 on a plan defined between the x-direction and the y-direction. The third inner surface 30*c* connects the first inner surface 30*a* and the second inner surface 30*b*. The third inner surface 30*c* provides a ceiling surface of the flow path 100. The third inner surface 30*c* is located parallel to the plan defined between the x-direction and the y-direction. The third inner surface 30*c* may be referred to as a connecting surface.

Note that the width direction of the flow path 100 or the flow path width in this specification is a direction perpendicular to the extending direction of the flow path 100. Therefore, the flow path width is in the y-direction in a first flow path 110. The flow path width is gradually changed from the y-direction through the x-direction to the y-direction again in a second flow path 120. The flow path width is again in the y-direction in a third flow path 130.

Note that the extension direction corresponds to a direction extending from a supply port 111 (described later) toward a discharge port 131 on the first inner surface 30*a* and the second inner surface 30*b*. Further, the extension direction corresponds to the flow direction of the cooling fluid.

Hereinafter, a part of the bottom portion 23 defined by the first inner surface 30*a* is referred to as a central wall portion 35. A part of the bottom portion 23 defined by the second inner surface 30*b* is referred to as an outer peripheral wall portion 40. The recessed portion 30 is defined by the first inner surface 30*a* of the central wall portion 35, the second inner surface 30*b* of the outer peripheral wall portion 40, and the third inner surface 30*c*.

Further, as shown in FIG. 3, the bottom portion 23 has a partition wall portion 70 protruding from the third inner surface 30*c* in a direction away from the third inner surface 30*c* in the z-direction. The partition wall portion 70 is described below.

<Cover>

As shown in FIG. 2, the cover 50 has a flat shape with a thin thickness in the z-direction. The cover 50 has a first main surface 50*a* and a second main surface 50*b* on the back side thereof, which are arranged in parallel in the z-direction.

The cover 50 is provided on the lower surface 23*b* such that the first main surface 50*a* is located to oppose the third inner surface 30*c*. The cover 50 is attached to the lower surface 23*b* of the central wall portion 35 and the lower surface 23*b* of the outer peripheral wall portion 40 in such a manner that the first main surface 50*a* is located to oppose to the third inner surface 30*c*. The cover 50 is mechanically connected to the lower surface 23*b* of the center wall portion 35 and the lower surface 23*b* of the outer peripheral wall portion 40 by a welding portions formed by a friction stir welding method. Therefore, the cover 50 is joined to the lower surface 23*b* to cover the central wall portion 35, the flow path 100, i.e., the recessed portion 30, and a part of the outer peripheral wall portion 40. The cover 50 covers an inner region of the outer peripheral wall portion 40.

Figure 5:
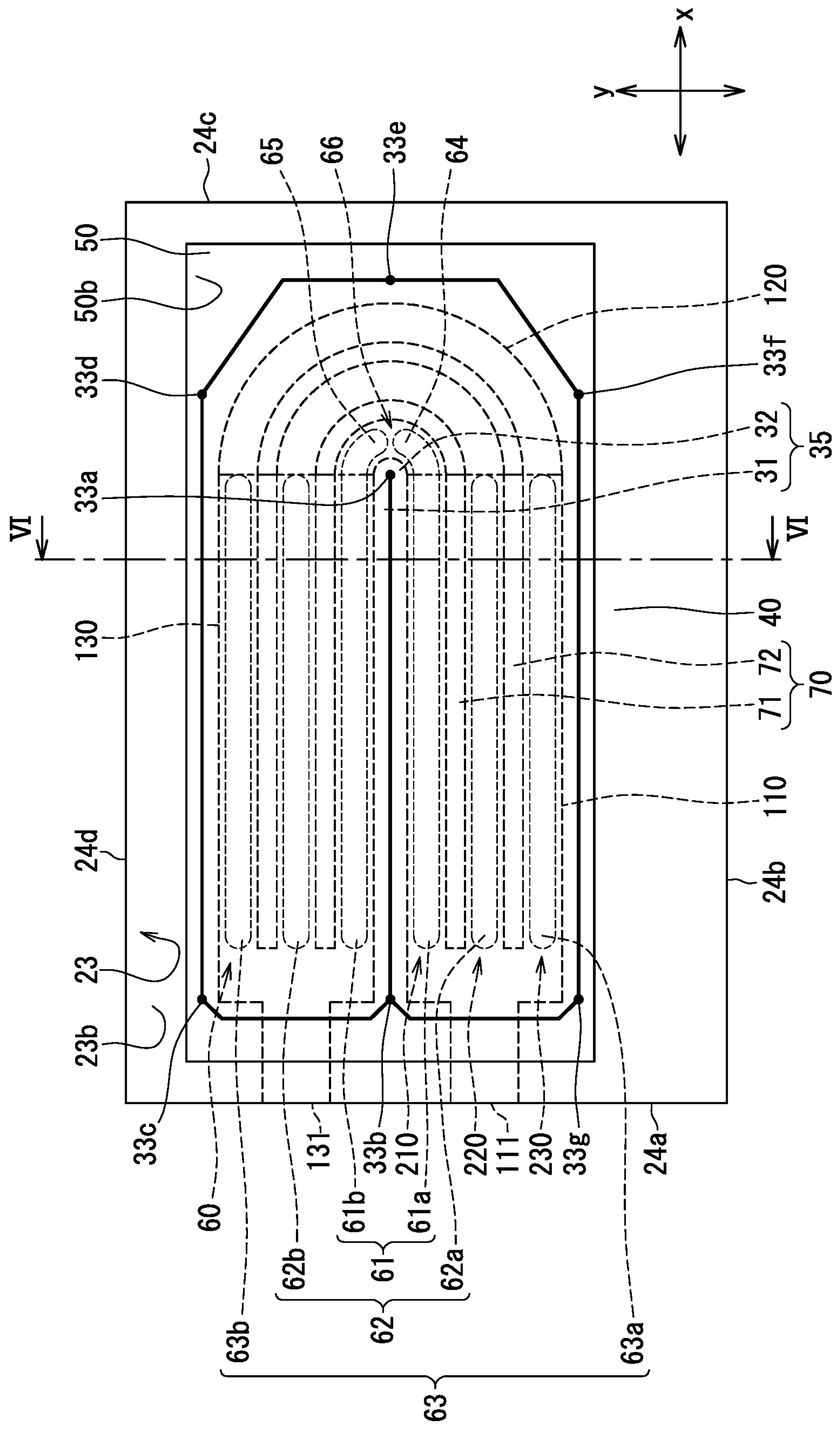
FIG. 5 is a plan view of the power control apparatus viewed from a side of the bottom.

More specifically, as shown in FIG. 5, the cover 50 is joined to the central wall portion 35 between the first joint portion 33*a* and the second joint portion 33*b*. Further, as shown in FIG. 5, the cover 50 is annularly joined to the outer peripheral wall portion 40 from the second joint portion 33*b* through to the seventh joint portion 33*g* so as to surround the recessed portion 30 in a circumferential direction about the z-direction. Note that the cover 50 is joined to the second central wall portion 32 of the central wall portion 35 at the first joint portion 33*a* described above.

For this purpose, the flow path 100 is defined by the first main surface 50*a*, the first inner surface 30*a*, the third inner surface 30*c*, and the second inner surface 30*b*. The flow path 100 is arranged in a U shape in a plan view in the z-direction.

Figure 4:
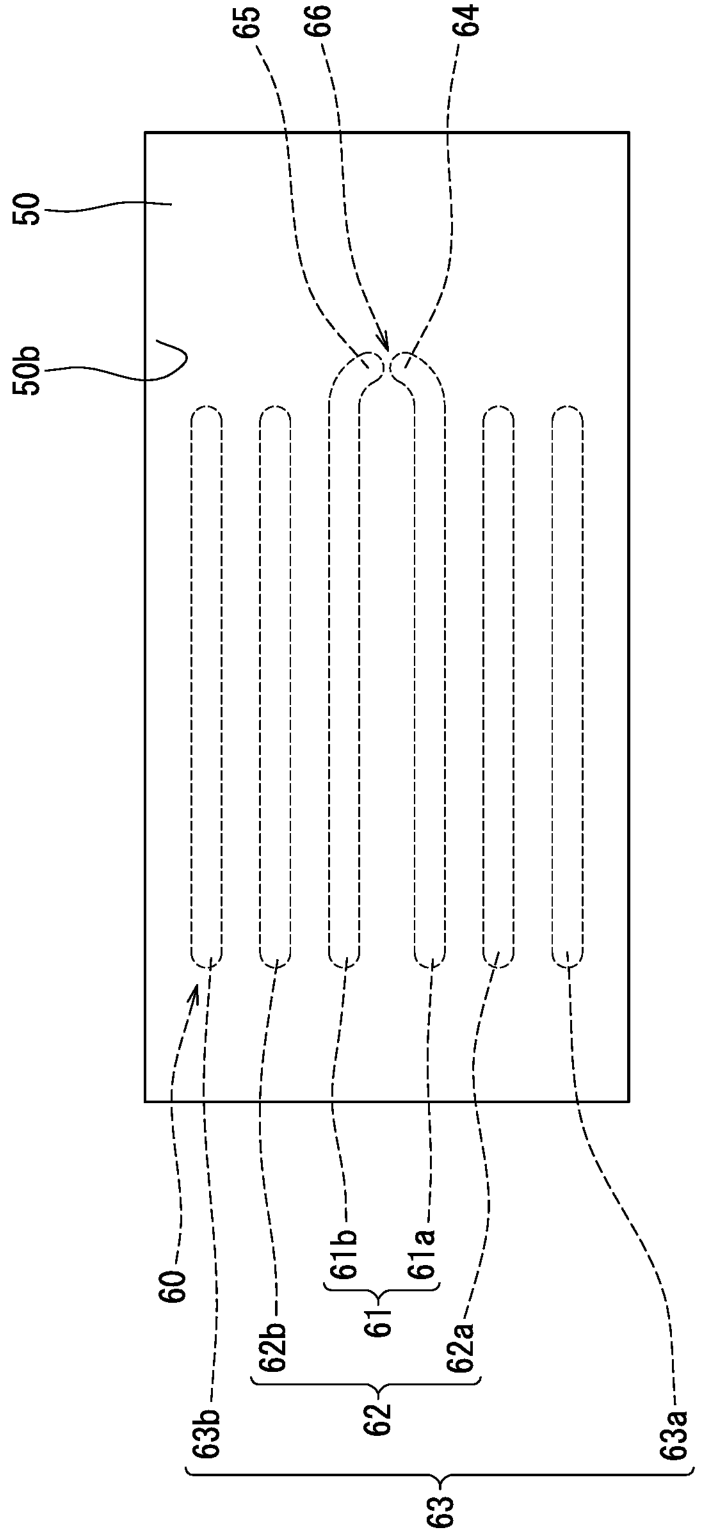
FIG. 4 is a plan view of a cover viewed from a second main surface.
Figure 6:
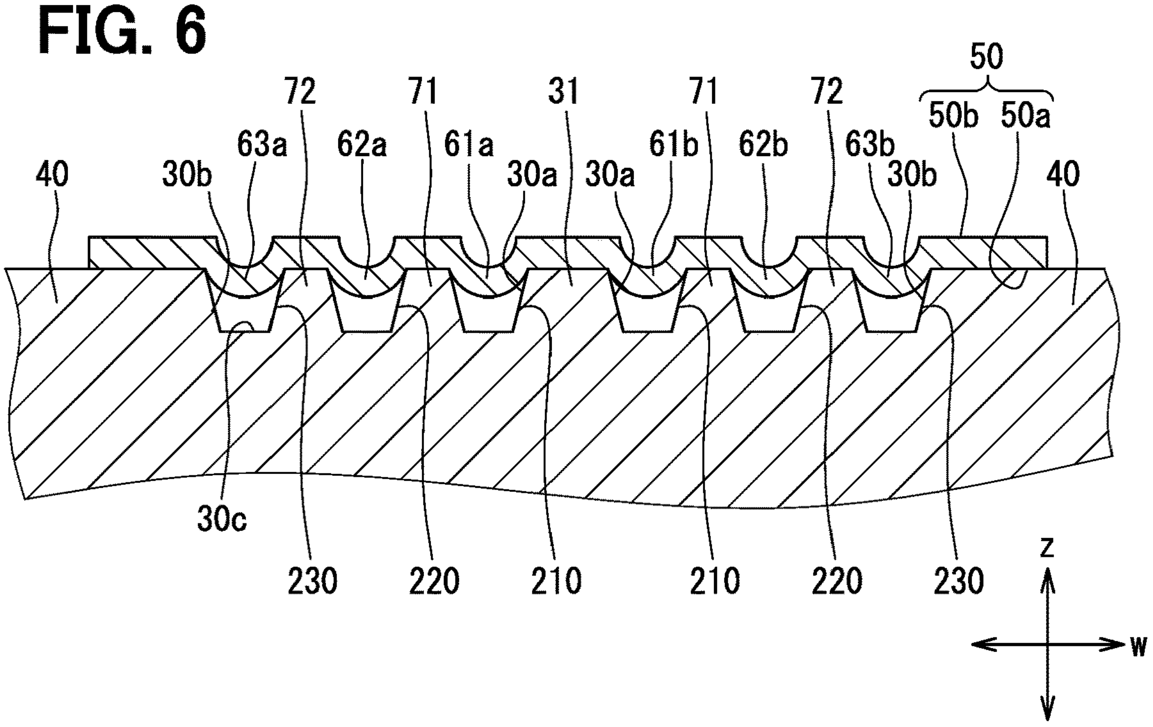
FIG. 6 is a cross-sectional view of the power control apparatus along a line VI-VI shown in FIG. 5.

As shown in FIG. 4, FIG. 5 and FIG. 6, the cover 50 is formed with at least one extension portion 60 that is recessed from the second main surface 50*b* toward the first main surface 50*a* and extends in the extension direction of the flow path 100. Note that the extension portion 60 may be also referred to as a bead. Details of the extension portion 60 is described below.

<Flow Path>

A specific form of the flow path 100 is described below. As shown in FIGS. 1 and 5, the flow path 100 has a first flow path 110, a second flow path 120, and a third flow path 130. The first flow path 110, the second flow path 120, and the third flow path 130 are arranged in order in the extension direction of the flow path 100.

As shown in FIGS. 1 and 5, the first flow path 110 and the third flow path 130 are spaced apart from each other in the y-direction in a parallel manner.

The first flow path 110 is placed on a side region to the second side portion 24*b* and extends along the x-direction. A supply port 111 is provided at one end of the first flow path 110 on a side to the first side portion 24*a*.

The third flow path 130 is placed on a side region to the fourth side portion 24*d* and extends along the x-direction. A discharge port 131 is provided at one end of the third flow path 130 on a side to the first side portion 24*a*.

The second flow path 120 is connected between the other end of the first flow path 110 on a side away from the supply port 111 and the other end of the third flow path 130 on a side away from the discharge port 131. The second flow path 120 extends from the supply port 111 toward the discharge port 131 in a turning manner. The second flow path 120 has a half circular shape in a plan view in the z-direction.

The extension direction of the flow path 100 corresponds to the x-direction in the first flow path 110 and the third flow path 130. The extension direction of the flow path 100 corresponds to a circumferential direction about the second central wall portion 32 in the second flow path 120.

In addition, a boundary between the first flow path 110 and the second flow path 120, and a boundary between the second flow path 120 and the third flow path 130 are shown by a two-dot chain line in the drawings. The boundary between the first flow path 110 and the second flow path 120 corresponds to a position where the flow path 100 begins to curve. The boundary between the second flow path 120 and the third flow path 130 corresponds to a position where the flow path 100 complete to curve.

Then, the cooling fluid is supplied to the first channel 110 from the supply port 111. After passing through the first flow path 110, the cooling fluid flows into the second flow path 120. After passing through the second flow path 120, the cooling fluid flows into the third flow path 130. The cooling fluid passed through the third flow path 130 is discharged from the discharge port 131.

Note that the embodiment in which the first flow path 110 is formed on a side region to the second side portion 24*b* and the third flow path 130 is formed on a side region to the fourth side portion 24*d* is illustrated. However, the first flow path 110 may be formed on a side region to the fourth side portion 24*d* and the third flow path 130 may be formed on a side region to the second side portion 24*b*.

<Central Wall>

As shown in FIGS. 1 and 5, the central wall portion 35 described above is provided between the first flow path 110, the second flow path 120, and the third flow path 130. The central wall portion 35 includes a first central wall portion 31 between the first flow path 110 and the third flow path 130, and a second central wall portion 32 surrounded by the second flow path 120 and the first central wall portion 31. The second central wall portion 32 is surrounded by the first flow path 110, the second flow path 120, and the third flow path 130, respectively. Further, as shown in FIGS. 1 and 5, the second central wall portion 32 has a substantially semi-circular shape.

<Partition Wall>

As described above, the bottom portion 23 has a partition wall 70 protruding from the third inner surface 30*c* in a direction away from the third inner surface 30*c* in the z-direction. As shown in FIGS. 3 and 5, the partition wall 70 has a first partition wall 71 and a second partition wall 72.

The first partition wall 71 and the second partition wall 72 extend in the extension direction of the flow path 100. That is, the first partition wall 71 and the second partition wall 72 have U shapes in a plan view in the z-direction.

The first partition wall 71 and the second partition wall 72 are spaced apart from each other in the width direction in a parallel manner. The first partition wall 71 and the second partition wall 72 are arranged in an order from the first partition wall 71 to the second partition wall 72 in a direction from the first inner surface 30*a* to the second inner surface 30*b* in a parallel manner.

Further, as shown in FIGS. 3 and 5, the flow path 100 is divided into three by the central wall portion 35, the first partition wall 71, the second partition wall 72, and the outer peripheral wall portion 40. Hereinafter, in order to simplify an explanation, a branch flow path between the central wall portion 35 and the first partition wall 71 is referred to as a first branch flow path 210. A branch flow path between the first partition wall 71 and the second partition wall 72 is referred to as a second branch flow path 220. A branch flow path between the second partition wall 72 and the outer peripheral wall portion 40 is referred to as a third branch flow path 230.

<Extension Portion>

As described above, the cover 50 is formed with at least one extension portion 60 that is recessed from the second main surface 50*b* toward the first main surface 50*a* and extends in the extension direction of the flow path 100. The flow path 100 is formed in a U shape. Therefore, the extension direction is straight in the first flow path 110. The extension direction is curved to gradually change a flow direction in the second flow path 120. The extension direction is again straight in the third flow path 130. The width direction of the flow path 100 is also changed gradually from the y-direction through the x-direction to the y-direction again. Therefore, the extension portion 60 is connected to the main flat portion of the cover 50 at an outer edge portion 66 of the extension portion 60. The extension portion 60 has a curved surface and is surrounded by the outer edge portion 66. The extension portion 60 is connected to the main flat portion of the cover 50 at straight parts of the outer edge portion 66. The extension portion 60 is connected to the main flat portion of the cover 50 at curved parts of the outer edge portion 66 on the extension direction. Note that the main flat portion of the cover 50 is a portion of the cover 50 excluding all of the extension portions 60. The main flat portion of the cover 50 may be simply referred to as the cover 50 below. Further, although it is not shown, the extension portion 60 may be thick in the extension direction. The extension portion 60 may have a so-called rib shape.

As shown in FIGS. 4 to 6, the extension portion 60 has a first extension portion 61, a second extension portion 62, and a third extension portion 63 arranged in parallel in the width direction. The first extension portion 61, the second extension portion 62 and the third extension portion 63 are arranged in an order from the first inner surface 30*a* toward the second inner surface 30*b* in a manner that are spaced apart in the width direction of the flow path in a parallel manner. Note that in order to simplify the explanation below, if describing a configuration common to the extension portions 61, 62, and 63, these components are referred to as the extension portion 60 as appropriate without distinguishing them. Further, since the extension portion 60 is curved, the extension portion 60 is easily elastically deformed.

Next, the positional relationship between the extension portion 60 and the flow path 100 is explained. As shown in FIG. 5, the first extension portion 61 is divided into a supply port side first extension portion 61*a* located on a side to the supply port 111 and a discharge port side first extension portion 61*b* located on a side to the discharge port 131.

Figure 7:
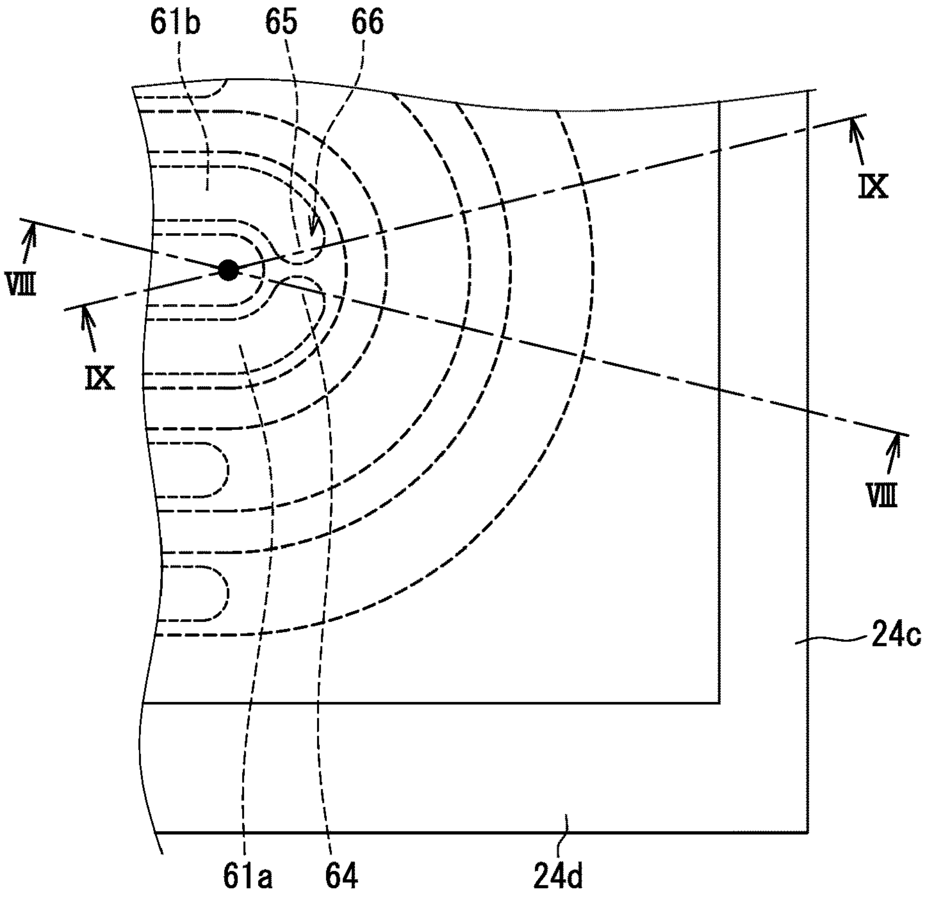
FIG. 7 is a partially enlarged plan view of the power control apparatus viewed from a side of the bottom.

As shown in FIGS. 5 to 7, the supply port side first extension portion 61*a* is provided in both the first branch flow path 210 of the first flow path 110 and the first branch flow path 210 of the second flow path 120.

The discharge port side first extension portion 61*b* is provided in both the first branch flow path 210 of the third flow path 130 and the first branch flow path 210 of the second flow path 120.

Further, a portion of the supply port side first extension portion 61*a* provided in the second flow path 120 extends along the second central wall portion 32 in a circumferential direction around the z-direction. Further, a portion of the discharge port side first extension portion 61*b* provided in the second flow path 120 extends along the second central wall portion 32 in a circumferential direction around the z-direction. Note that a center line of the second central wall portion 32 extends in the z-direction. A portion of the supply port side first extension portion 61*a* provided in the second flow path 120 and a portion of the discharge port side first extension portion 61*b* provided in the second flow path 120 are located to extend along a circumferential direction which is defined around the center line of the second central wall portion 32.

Figure 8:
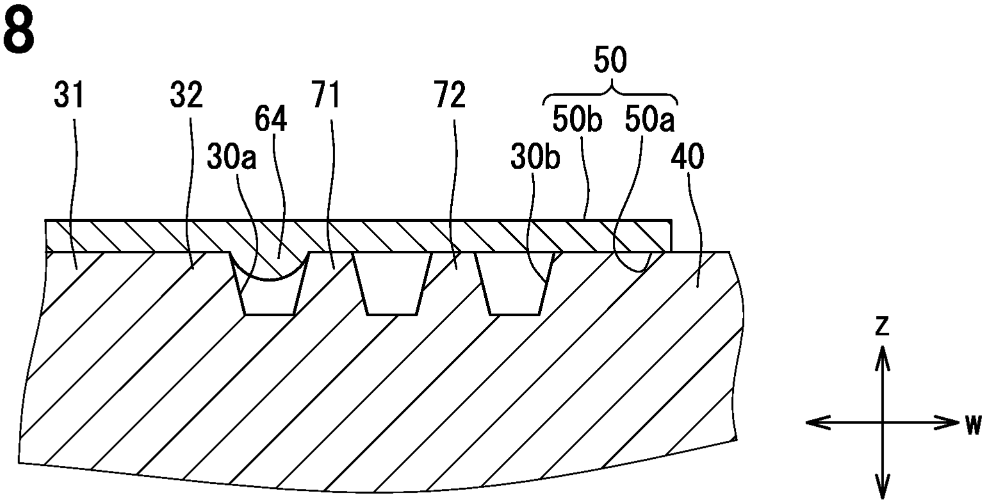
FIG. 8 is a cross-sectional view of the power control apparatus along a line VIII-VIII shown in FIG. 7.

As shown in FIG. 8, a first end edge portion 64 at a distal end of a portion of the supply port side first extension portion 61*a* provided in the second flow path 120 is protrude into the second flow path 120. The first portion 64 provides an outer surface which is a part of a spherical shape. A width of the first end edge portion 64 in the width direction of the flow path 100 at a cross section shown in FIG. 8 is the same as an opening width of the flow path 100 provided by the recess 30.

Figure 9:
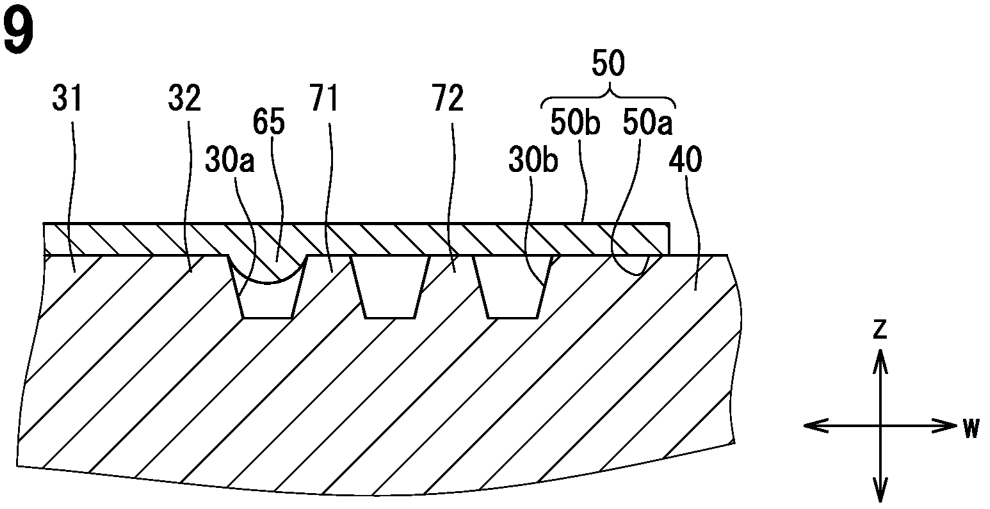
FIG. 9 is a cross-sectional view of the power control apparatus along a line IX-IX shown in FIG. 7.

As shown in FIG. 9, a second end edge portion 65 at a distal end of a portion of the discharge port side first extension portion 61*b* provided in the second flow path 120 is protrude into the second flow path 120. The second portion 65 provides an outer surface which is a part of a spherical shape. A width of the second end edge portion 65 in the width direction of the flow path 100 at a cross section shown in FIG. 8 is the same as an opening width of the flow path 100 provided by the recess 30. As a result, a curved outer surface of the extension portions 60, including the distal ends, provides an upper surface of the flow path 100 and receives a pressure of the cooling fluid. This arrangement reduces a flat surface area of the cover 50 to receive a pressure of the cooling fluid.

Figure 10:
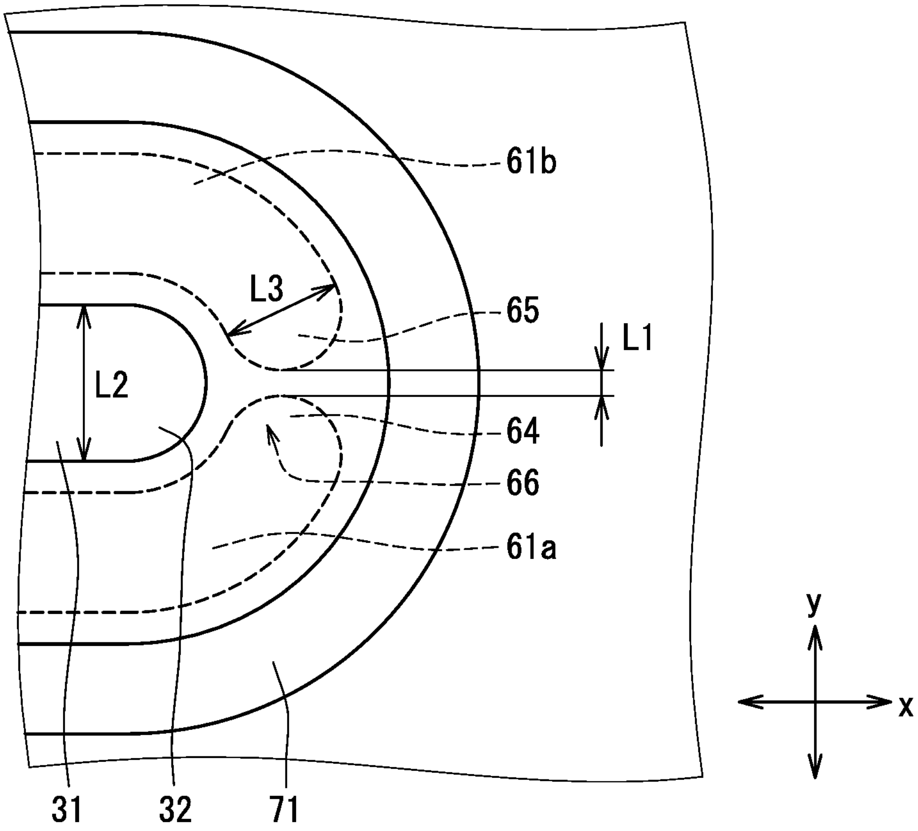
FIG. 10 is a plan view of the power control apparatus illustrating a relationship between a separating distance between end portions and a width of an extension portion and a second central portion.

Further, as shown in FIGS. 7 and 10, the first end edge portion 64 and the second end edge portion 65 are located to oppose each other in the extending direction. As described above, the cover 50 is joined to the second central wall portion 32 at the first joint portion 33*a*. Further, the first joint portion 33*a* is located between the first end edge portion 64 and the second end edge portion 65 as a center of an imaginary circle defined by the first end edge portion 64 and the second end edge portion 65.

The first joint portion 33*a* is located within a projection area of a gap between the first end edge portion 64 and the second end edge portion 65 onto the second central wall portion 32. Note that in the drawings, the width direction is shown as the w-direction. In the drawings, "direction" is omitted.

Further, as shown in FIG. 10, a distance L1 between the first end edge portion 64 and the second end edge portion 65 of the discharge port side first extension portion 61*b* is smaller than an average width L2 of the first central wall 31 in the y-direction. Further, the distance L1 between the first end edge portion 64 and the second end edge portion 65 is smaller than an average width L3 of the first extension portion 61 in the width direction.

In addition, an average width L3 of the supply port side first extension portion 61*a* and an average width L3 of the discharge port side first extension portion 61*b* are equal to each other in this embodiment.

However, one of the average width L3 of the supply port side first extension portion 61*a* and the average width L3 of the discharge port side first extension portion 61*b* may be smaller than the other one of the average width L3 of the supply port side first extension portion 61*a* and the average width L3 of the discharge port side first extension portion 61*b*. In this case, the distance L1 between the first end edge portion 64 and the second end edge portion 65 may be smaller than a smaller one of the average width L3 of the supply port side first extension portion 61*a* and the average width L3 of the discharge port side first extension portion 61*b*.

Further, as shown in FIGS. 4 to 6, the second extension portion 62 is divided into a supply port side second extension portion 62*a* and a discharge port side second extension portion 62*b*. The supply port side second extension 62*a* is provided in the second branch flow path 220 of the first flow path 110. The discharge port side second extension 62*b* is provided in the second branch path 220 of the third flow path 130.

Further, as shown in FIGS. 4 to 6, the third extension portion 63 is divided into a supply port side third extension portion 63*a* and a discharge port side third extension portion 63*b*. As shown in FIGS. 5 to 7, the supply port side third extension portion 63*a* is provided in the third branch flow path 230 of the first flow path 110. The discharge port side third extension 63*b* is provided in the third branch path 230 of the third flow path 130.

<Method for Manufacturing Power Control Apparatus>

Next, a method for manufacturing the power control apparatus 1 is explained. The process of manufacturing the power control apparatus 1 includes a process of manufacturing the case 10 and a process of accommodating electrical components such as the converter unit 15 inside the case 10.

In the process of manufacturing the case 10, a worker first manufactures the main body 20 and the cover 50. The worker manufactures the main body 20, e.g., by casting method. The worker manufactures the cover 50 by press working.

When manufacturing the cover 50, the worker performs a drawing process to a raw material for the cover 50 to form each of the first to third extension portions 61 to 63.

Specifically, first, a raw material for the cover 50 is placed on a lower forming die having recesses in a desired shape. Then, an upper forming die, i.e., punch, which has a shape being inserted into the recesses, is pressed against the raw material for the cover 50 and the lower forming die. As a result, the extension portions 60, including a first extension portion 61, a second extension portion 62, and the third extension portion 63 are formed on the raw material.

After manufacturing the main body 20 and the cover 50, in the manufacturing process of the case 10, the worker performs a temporary attachment process of temporarily attaching the cover 50 to the main body 20.

In this temporary assembling process, the cover 50 is temporarily placed on the lower surface 23*b* of the main body 20 so that each one of the first extension portion 61, the second extension portion 62 and the third extension portion 63 enters each one of corresponding portions defining the first branch flow path 210, the second branch flow path 220, and the third branch flow path 230, respectively, as shown in FIG. 6.

Next, a joining process is performed. In this joining step, the main body 20 and the cover 50 are fixed by using the friction stir welding method. In performing the friction stir welding method, a tool rotating at high speed is pressed against the cover 50 and the cover 50 is joined to the bottom portion 23 by frictional heat between the tool and the cover 50.

In this embodiment, the friction stir welding method is performed continuously to form a welding portion continuous along a periphery of the recessed portion 30 as shown in FIG. 5. Specifically, first, the tool is moved along the x-direction from the first joint portion 33*a* toward the second joint portion 33*b*. Thereafter, the tool is moved in a clockwise direction in one stroke so as to pass through the third joint portion 33*c*, the fourth joint portion 33*d*, the fifth joint portion 33*e*, the sixth joint portion 33*f*, and the seventh joint portion 33*g* in this order. This joins the main body 20 and the cover 50. Note that the friction stir welding method may be referred to as FSW.

After completing the process of manufacturing the case 10 in this manner, the operator performs a process of accommodating electrical components such as the converter unit 15 into the case 10. In the process of accommodating the electrical components such as the converter unit 15 in the case 10, the converter unit 15, the capacitor unit 16, and the reactor unit 17 are placed on the internal space 21 of the case 10.

The converter unit 15 is placed on a side of the third side portion 24*c* so as to overlap the second flow path 120 in a plan view in the z-direction. The reactor unit 17 is placed on a side of the first side portion 24*a* and on a side of the fourth side portion 24*d* so as to overlap the first flow path 110 and the third flow path 130 in a plan view in the z-direction. The capacitor unit 16 is placed on a side of the second side portion 24*b* and on a side of the first side portion 24*a* so as to overlap the outer peripheral wall portion 40 in a plan view in the z-direction.

Note that the arrangement of electrical components in the internal space 21 is not limited to the above configuration. The capacitor unit 16 may be arranged to overlap with at least one of the first flow path 110, the second flow path 120 and the third flow path 130 in a plan view in the z-direction.

<Internal Pressure of Cooling Fluid>

As described above, the flow path 100 is formed to enable the cooling fluid flows there through. The cooling fluid is supplied to the supply port 111 by an external pump. Therefore, pulsations may occur in the cooling fluid as the pump is driven. Furthermore, the cooling fluid may be subject to a linear expansion due to a heat generated by the electrical components.

As a result, an internal pressure of the cooling fluid flowing through the flow path 100 may increase. The internal pressure is a pressure acting in the normal direction from the cooling fluid flowing in the flow path 100 toward a portion defining the flow path 100, such as the bottom portion 23 and the cover 50. This internal pressure causes the cover 50 to expand and deform in the z-direction so as to separate from the bottom portion 23. As a result, the first joint portion 33*a* receives expanding deformation of the cover 50 caused by an internal pressure, e.g., from three directions, and is subject to a stress which is the most excessive.

<Operations and Advantages>

In contrast, in this embodiment, the cover 50 is formed with the extension portion 60 which is recessed from the second main surface 50*b* toward the first main surface 50*a* and extends in the extending direction of the flow path 100. Since the extension portion 60 is curved, the extension portion 60 is easily elastically deformed. The cover 50 is joined to the bottom portion 23 such that the extension portion 60 enters into corresponding one of the branch flow paths.

The first branch flow path 210, the second branch flow path 220, and the third branch flow path 230 are divided by two wall portions adjacent in the width direction among the central wall portion 35, the first partition wall 71, the second partition wall 72, and the outer peripheral wall portion 40 arranged in the width direction of the flow path in a parallel manner.

If the internal pressure of the cooling fluid increases, the cover 50 deforms in the z-direction so as to separate the cover 50 from the bottom portion 23. At this time, the cooling fluid acts on the extension portion 60 to deform each one of convex portions, e.g., to push each arch shape back in the z-direction. The deformation of the cover 50 is dispersed over the surface area. A stress concentration on the joining portion is reduced. Specifically, a stress acting on the first joint portion 33*a* is significantly reduced. As a result, stress applied to the joint portion between the cover 50 and the bottom portion 23 is easily relaxed. For example, concentration of stress on the first joint portion 33*a* between the cover 50 and the second central wall portion 32 is easily suppressed. Accordingly, it is possible to easily suppress a deformation of the cover 50 in the z-direction so as to separate from the bottom portion 23 at the first joint portion 33*a*.

Further, in this embodiment, the extension portions 60 are connected to the cover 50 at outer edge portions 66 located at both longitudinal ends in the width direction and located at both shorthand ends in the extension direction. Again, the outer edge portion 66 defines an outer shape of the extension portion 60. Parts of the outer edge portion 66 located at both longitudinal ends in the extension direction include the first end edge portion 64 and the second end edge portion 65. In addition, if explaining a configuration common to the first end edge portion 64 and the second end edge portion 65, the first end edge portion 64 and the second end edge portion 65 are not distinguished and are referred to as the outer edge portion 66 as appropriate. Note that the outer edge portion 66 in the extension direction may include a plurality of outer edge portions 66 in addition to the first end edge portion 64 and the second end edge portion 65.

As described above, the outer edge portion 66 of the extension portion 60 in the extension direction extends in the width direction. According to this, the cover 50 is difficult to deform in the z-direction in the width direction. Therefore, it is possible to easily suppress a deformation of the cover 50 in the z-direction in the width direction, when an internal pressure is applied to the cover 50 from the cooling fluid. Accordingly, stress concentration on the first joint portion 33*a* between the cover 50 and the second central wall portion 32, for example, is easily suppressed. It is possible to easily suppress a deformation of the cover 50 in the z-direction so as to separate from the bottom portion 23 at the first joint portion 33*a*.

As explained above, the extension portion 60 is divided. A divided one of the extension portion 60 has a first end edge portion 64. The divided other one of the extension portion 60 has a second end edge portion 65. The first end edge portion 64 and the second end edge portion 65 extend in curved shapes to approach each other in the y-direction.

The extension portion 60 is segmented to form an increased number of outer edge portions 66. Therefore, it is possible to easily suppress a deformation of the cover 50 in the z-direction in the width direction, when an internal pressure is applied to the cover 50 from the cooling fluid. It is possible to easily suppress a deformation of the cover 50 in the z-direction so as to separate from the bottom portion 23 at the first joint portion 33*a*.

As described above, a part of the supply port side first extension portion 61*a* provided in the second flow path 120 extends along the second central wall portion 32 in a circumferential direction of an imaginary circle about the first joint portion 33*a*. Accordingly, a part of the discharge port side first extension portion 61*b* provided in the second flow path 120 extends along the second central wall portion 32 in the circumferential direction. Accordingly, the first end edge portion 64 and the second end edge portion 65 are provided in the second flow path 120. The first end edge portion 64 and the second end edge portion 65 are located to oppose each other in extending directions. Further, the first joint portion 33*a* is located between the first end edge portion 64 and the second end edge portion 65 as a center of an imaginary circle defined by the first end edge portion 64 and the second end edge portion 65. The first joint portion 33*a* is located within a projection area of a gap between the first end edge portion 64 and the second end edge portion 65 onto the second central wall portion 32.

Accordingly, it is possible to easily suppress a deformation of the cover 50 in the z-direction so as to separate from the bottom portion 23 at the first joint portion 33*a* in an effective manner.

Note that, unlike this embodiment, in the case that the supply port side first extension portion 61*a* and the discharge port side first extension portion 61*b* are not provided around the first joint portion 33*a*, the cover 50 is easily deformed at the first joint portion 33*a* in the z-direction so as to separate from the bottom portion 23.

Further, even if the first extension portion 61 extends continuously to surround the first joint portion 33*a*, the cover 50 is easily deformed so as to be separated from the bottom portion 23 in the z-direction at the first joint portion 33*a*. Further, in the case where the first extension portion 61 extends continuously in the circumferential direction around the first joint portion 33*a*, there is a concern that the dimensions of the cover 50 as a product may not fit within a tolerance due to shrinkage after press working.

As described above, the first end edge portion 64 and the second end edge portion 65 extends in a curved shape to orbit along the first joint portion 33*a*. The first end edge portion 64 curves along a circular orbital path about the first joint portion 33*a*. The first end edge portion 64 extends along the circular orbital path over a range less than 90 degrees. The second end edge portion 65 curves along a circular orbital path about the first joint portion 33*a*. The second end edge portion 65 extends along the circular orbital path over a range less than 90 degrees. The first end edge portion 64 and the second end edge portion 65 are separated with each other at distal ends to form a distance d1. The distance L1 between the first end edge portion 64 and the second end edge portion 65 is smaller than the average width L2 of the first central wall portion 31 in the y-direction and the average width L3 of the first extension portion 61 in the width direction.

According to this, the first joint portion 33*a* faces the supply port side first extension portion 61*a* over an elongated length provided by a curved length of the first end edge portion 64. Similarly, the first joint portion 33*a* faces the discharge port side first extension portion 61*b* over an elongated length provided by a curved length of the second end edge portion 65. In other words, the first joint portion 33*a* is capable of being surrounded by both the first end edge portion 64 and the second end edge portion 65. The width direction of the flow path 100 is gradually changed along the first end edge portion 64. The width direction of the flow path 100 is gradually changed along the second end edge portion 65. Therefore, the first joint portion 33*a* faces both the supply port side first extension portion 61*a* and the discharge port side first extension portion 61*b* with respect to the width direction of the flow path 100 over circular ranges. The total length of the circular ranges is longer than that if the first end and the second end extended straight. It is possible to easily suppress a deformation of the cover 50 in the z-direction so as to separate from the second central wall portion 32. It is possible to easily suppress a deformation in the z-direction so as to separate from the bottom portion 23 in the width direction at the first joint portion 33*a* in an effective manner.

Second Embodiment

Figure 11:
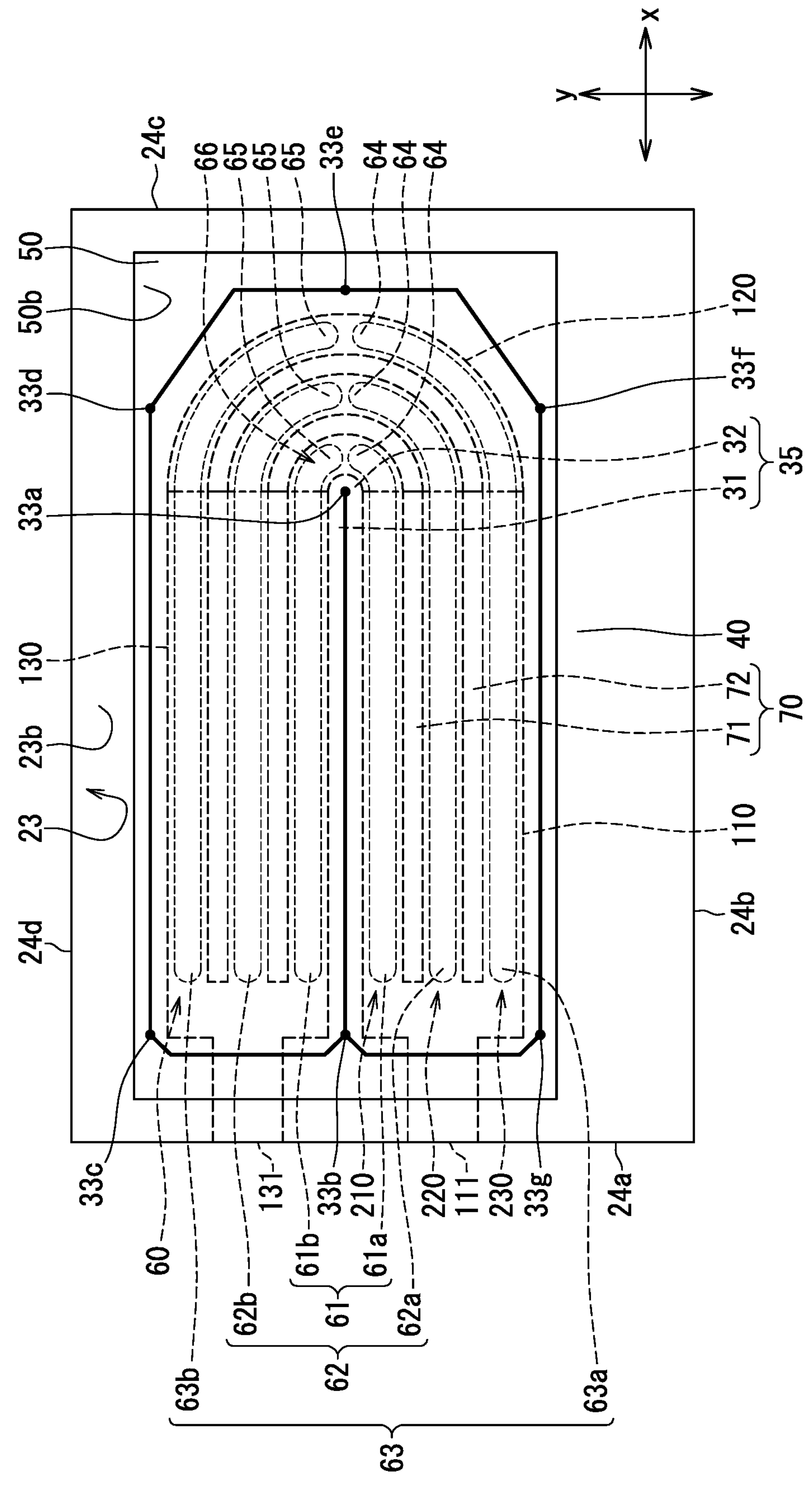
FIG. 11 is a plan view of a power control apparatus viewed from a side of the bottom according to a second embodiment.

It is described that an embodiment in which the supply port side first extension portion 61*a* and the discharge port side first extension portion 61*b* are provided in the first branch flow path 210 of the second flow path 120 in the present embodiment. However, as shown in FIG. 11, the second supply port side extension portion 62*a* and the discharge port side second extension portion 62*b* may be provided in the second branch flow path 220 of the second flow path 120. The supply port side third extension portion 63*a* and the discharge port side third extension portion 63*b* may be provided in the third branch flow path 230 of the second flow path 120.

In this case, a part of the supply port side second extension portion 62*a* provided in the second flow path 120 extends along the second central wall portion 32 in a circumferential direction. A part of the discharge port side second extension portion 62*b* provided in the second flow path 120 extends along the second central wall portion 32 in a circumferential direction. The first end edge portion 64 and the second end edge portion 65 are located to oppose each other in extending directions. Further, the first joint portion 33*a* is located between the first end edge portion 64 and the second end edge portion 65 as a center of an imaginary circle defined by the first end edge portion 64 and the second end edge portion 65.

In this case, a part of the supply port side third extension portion 63*a* provided in the second flow path 120 extends along the second central wall portion 32 in a circumferential direction. A part of the discharge port side third extension portion 63*b* provided in the second flow path 120 extends along the second central wall portion 32 in a circumferential direction. The first end edge portion 64 and the second end edge portion 65 are located to oppose each other in extending directions. Further, the first joint portion 33*a* is located between the first end edge portion 64 and the second end edge portion 65 as a center of an imaginary circle defined by the first end edge portion 64 and the second end edge portion 65.

According to this, the number of outer edge portions 66 provided in the second flow path 120 increases. Therefore, it is possible to easily suppress a deformation of the cover 50 in the z-direction in the width direction, when an internal pressure is applied to the cover 50 from the cooling fluid. It is possible to easily suppress a deformation of the cover 50 in the z-direction so as to separate from the bottom portion 23 at the first joint portion 33*a* in an efficient manner.

Although not shown, the first end edge portion 64 and the second end edge portion 65 may not have to oppose each other in the extension direction. The first end edge portion 64 and the second end edge portion 65 may not have to oppose each other in extending directions.

If the first end edge portion 64 and the second end edge portion 65 are located to oppose each other in the extension direction, a distance from the first joint portion 33*a* to both the first end edge portion 64 and the second end edge portion 65 is shorter than that if the first end edge portion 64 and the second end edge portion 65 extend in straight. Therefore, it is possible to easily suppress a deformation of the cover 50 in the z-direction in the width direction at the first joint portion 33*a* of the cover 50.

Third Embodiment

Figure 12:
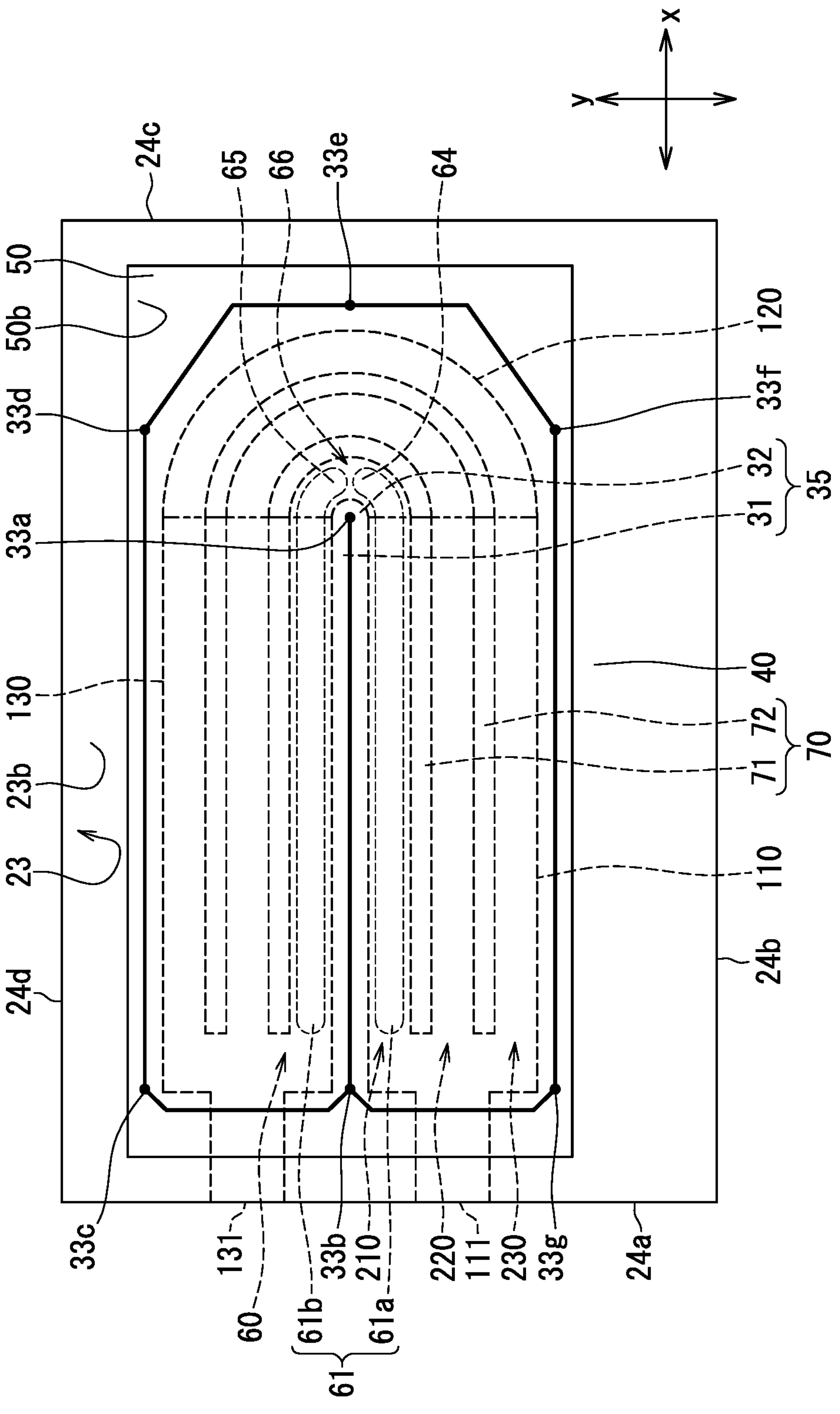
FIG. 12 is a plan view of a power control apparatus viewed from a side of the bottom according to a third embodiment.

It is described that an embodiment in which the extension portion 60 has the first extension portion 61, the second extension portion 62, and the third extension portion 63 in this embodiment. However, as shown in FIG. 12, the extension portion 60 may include only the first extension portion 61. Furthermore, a distance L1 between the supply port side first extension portion 61*a* and the discharge port side first extension portion 61*b* may be formed larger than both the average width L2 of the first central wall portion 31 in the y-direction and the average width L3 in the width direction of the first extension portion 61. Further, although not shown, the extension portion 60 may include either the second extension portion 62 or the third extension portion 63. The supply port side extension portion and the discharge port side extension portion may be shifted in the width direction. Note that the supply port side extension portion is a collective name for the supply port side first extension portion 61*a* to the supply port side third extension portion 63*a*. The discharge port side extension portion is a collective name for the discharge port side first extension portion 61*b*, the discharge port side second extension portion 62*b*, and the discharge port side third extension portion 63*b*.

Fourth Embodiment

Figure 13:
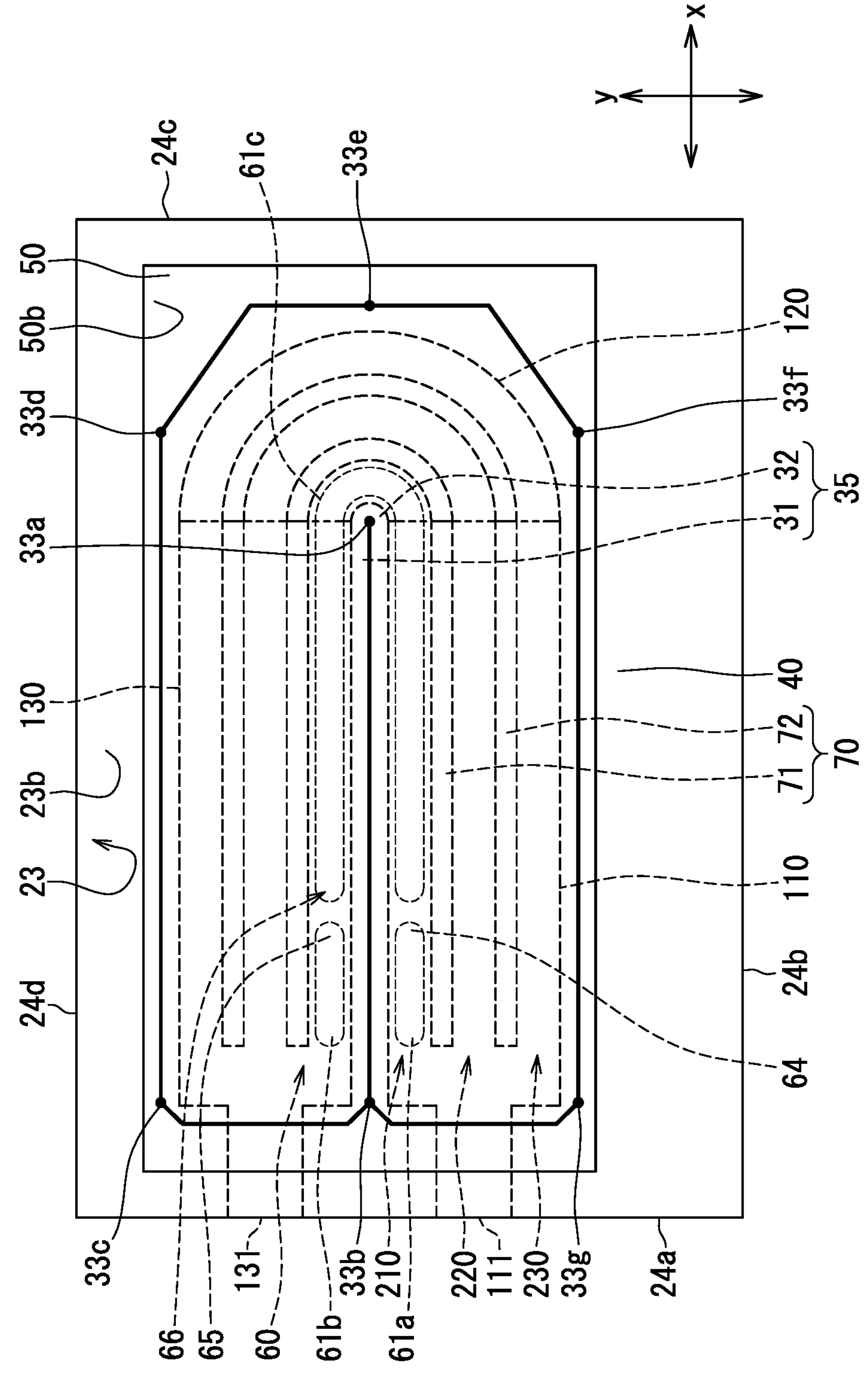
FIG. 13 is a plan view of a power control apparatus viewed from a side of the bottom according to a fourth embodiment.

In addition, as shown in FIG. 13, the first extension portion 61 may include a relaying portion 61*c* located between the supply port side first extension portion 61*a* and the discharge port side first extension portion 61*b*, in addition to the supply port side first extension portion 61*a* and the discharge port side first extension portion 61*b*. Each one of the outer edge portions 66 of the supply port side first extension portion 61*a*, the discharge port side first extension portion 61*b*, and the relaying portion 61*c* may not have to be provided in the second flow path 120. Even in that case, the cover 50 is difficult to deform in the z-direction in the width direction.

Moreover, two or more relaying portions 61*c* may be provided. Conversely, only one of the supply port side first extension portion 61*a*, the discharge port side first extension portion 61*b*, and the relaying portion 61*c* may be provided in the flow path 100. According to this, it is possible to suppress a deformation of the cover 50 in the arrangement direction in the width direction. Alternatively, the flow path 100 may not have a U shape in a plan view in the z-direction. The shape of the flow path 100 is not limited to a U shape. For example, the flow path 100 may extend in one direction. The flow path 100 may be bent in a middle.

Other Embodiments

Furthermore, the case 10 and the power control apparatus 1 may be mounted on a vehicle in any orientation. For example, the power control apparatus 1 may be mounted on the vehicle with the upper surface 23*a* positioned lower than the lower surface 23*b* in the gravitational direction. Further, the power control apparatus 1 may be mounted on the vehicle in such a manner that two among the first side portion 24*a*, the second side portion 24*b*, the third side portion 24*c* and the fourth side portion 24*d* are located to oppose each other in the gravitational direction.

Although the present disclosure has been described in accordance with the examples, it is understood that the present disclosure is not limited to such examples or structures. The present disclosure encompasses various modified examples and modifications within an equivalent scope. In addition, although various combinations and modes are shown in the present disclosure, other combinations and modes including only one element, more elements, or less elements are also within the scope and idea of the present disclosure.

<Configuration Group A>

Figure 14:
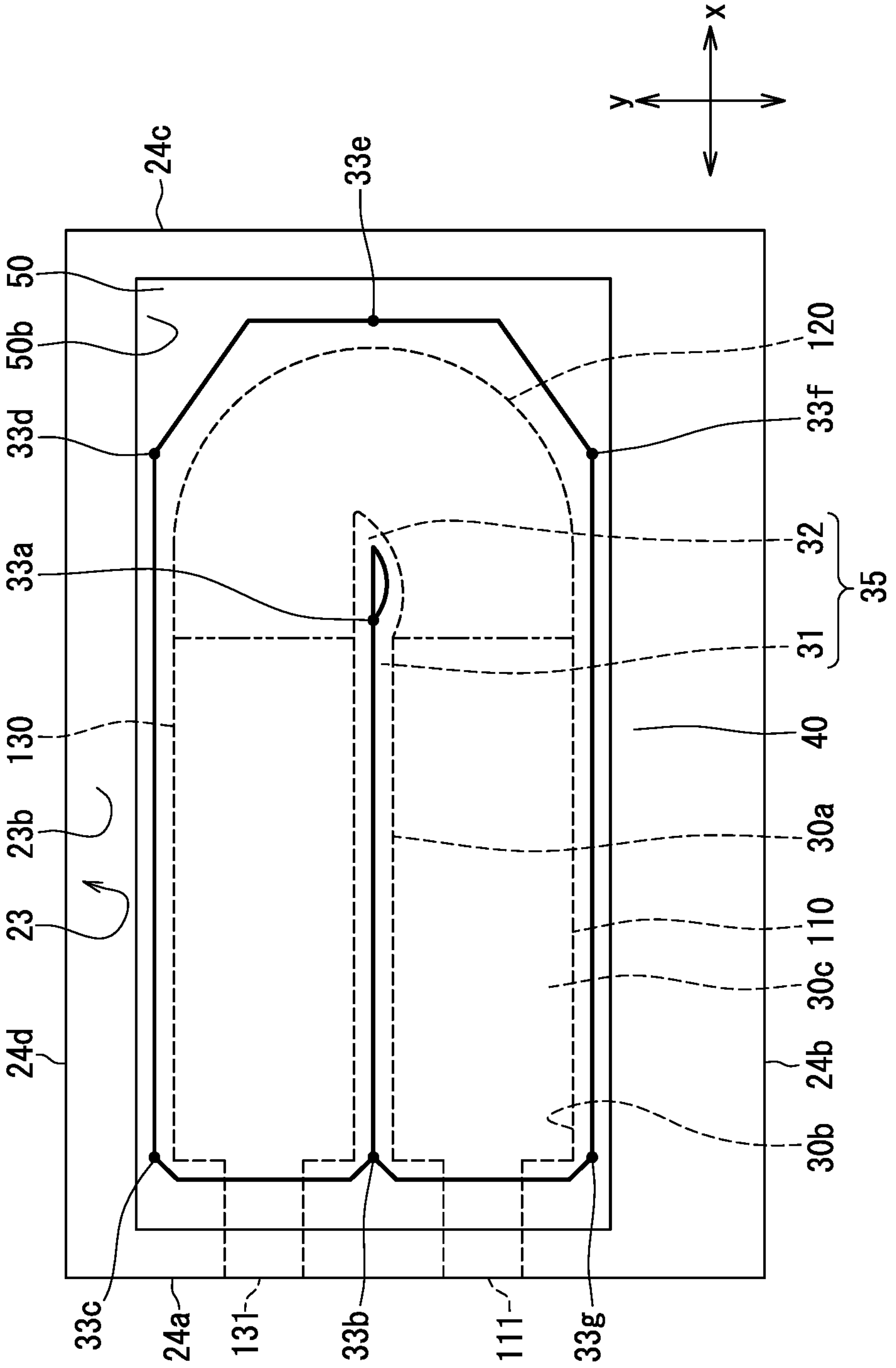
FIG. 14 is a plan view of a power control apparatus viewed from a side of the bottom explaining a configuration group (A).

The maximum width of the second central wall portion 32 in the y-direction may be larger than the maximum width of the first central wall portion 31 in the y-direction in each of the embodiments described above. As shown in FIG. 14, the second central wall portion 32 may be widened in the y-direction relative to the first central wall portion 31. The width of the second central wall portion 32 is widened to a side of the second side portion 24*b* and is not widened to a side of the fourth side portion 24*d*. The second central wall portion 32 is defined with a curved surface of the first inner surface 30*a* on a side to the second side portion 24*b* and a straight surface of the first inner surface 30*a* on a side to the fourth side portion 24*d*.

Note that, as shown in FIG. 14, a boundary between the first flow path 110 and the second flow path 120 corresponds to a beginning of the curve of the second central wall portion 32. As shown in FIG. 14, a beginning boundary of the second flow path 120 and an ending boundary of the second flow path 120 are intentionally located in a symmetric manner in the x-direction. In the illustrated example, the beginning boundary and the ending boundary are on an imaginary line perpendicular to the x-direction. The beginning boundary is located between the first flow path 110 and the second flow path 120. The ending boundary is located between the second flow path 120 and the third flow path 130. The beginning boundary and the ending boundary are located correspondingly with each other.

Further, as shown in FIG. 14, the first joint portion 33*a* may be provided near the boundary between the first central wall portion 31 and the second central wall portion 32. The welding portion formed by the friction stir welding method may extend along the first inner surface 30*a* of the second central wall portion 32 from the first joint 33*a*. As a result, the cover 50 and the second central wall portion 32 may be welded with an annularly extending welding portion. In that case, a relatively wider joint area is formed between the cover 50 and the second central wall portion 32.

If an internal pressure of the cooling fluid passing through the flow path 100 increases, the cover 50 is deformed in the z-direction so as to separate from the bottom portion 23, but as described above, the joint area between the cover 50 and the second central wall portion 32 is increased to withstand the deformation and stress concentration. As a result, the stress applied to the joint portion between the cover 50 and the second central wall portion 32 is easily relaxed. Accordingly, it is possible to easily suppress a deformation of the cover 50 in the z-direction so as to separate from the second central wall portion 32.

Further, at least one of distal ends of the annularly extending welding portion provides an acute angle. In the illustrated example, both ends of the annularly extending welding portion provide acute angles. A curved welding portion extends between the first joining portion 33*a* and the distal end in the x-direction along the first inner surface 30*a* of the second central wall portion 32 in an angle smaller than 180 degrees. A straight welding portion extends between the distal end and the joining portion 33*b* through the first joining portion 33*a*. As a result, the curved welding portion and the straight welding portion form acute angles on both ends. According to this, a joint portion between the cover 50 and the second central wall portion 32 is located closer to a side of the first inner surface 30*a* of the second central wall portion 32. In that case, a relatively wider joint area is formed between the cover 50 and the second central wall portion 32.

Although not shown, the width of the second central wall portion 32 in the y-direction may be increased toward the fourth side portion 24*d*. Alternatively, the width of the second central wall portion 32 in the y-direction may be increased so that the second central wall portion 32 is widened toward both the second side portion 24*b* and the fourth side portion 24*d*.

Next, a method for manufacturing the power control apparatus 1 and the case 10 is described. First, the cover 50 is placed to abut on the bottom portion 23 of the main body 20, and perform temporary positioning of the cover 50 with respect to the main body 20 for a next process. Next, a friction stir welding tool is pressed so that the cover 50 is pressed against the second central wall portion 32 at the first joint portion 33*a*. Next, the tool is moved annularly from the first joint portion 33*a* in an annular welding path along the first inner surface 30*a* of the second central wall 32. In other words, the tool is moved annularly from the first joint portion 33*a* along an edge of the second central wall portion 32 on a side of the second flow path 120.

Next, the tool is returned to the first joint portion 33*a*, and is moved to reach the second joint portion 33*b*. Then, the tool is moved along an annular orbital path around the flow path 100 so that the tool passes through the third joint portion 33*c*, the fourth joint portion 33*d*, the fifth joint portion 33*e*, the sixth joint portion 33*f*, and the seventh joint portion 33*g* in this order. The tool is moved until to the second joint portion 33*b*.

As a result, the cover 50 is welded, by the friction stir welding method, to the central wall portion 35 and the outer peripheral wall portion 40, respectively. The cover 50 and the bottom portion 23 of the main body 20 are joined by the friction stir welding method, it is possible to reduce a size compared to a case where they are joined with screws or the like. An increase in the number of parts is suppressed.

<Features of Configuration Group A>

In a configuration in which a main body formed with a U shaped flow path by a partition wall portion and a cover are welded by the friction stir welding method, if a distal end of the partition wall portion on a side where the flow path curves is locally joined to the cover, a joining area of them could be narrowed. Therefore, if a stress is concentrated on this joint portion, there is a risk that the cover 50 may deform so as to separate from the distal end (the second central wall portion) of the partition wall on a side where the flow path curves.

On the other hand, the configuration disclosed in the present specification includes the features of the configuration group A as follows. According to the feature A1 below, it is possible to suppress narrowing the joining area between the cover 50 and the second central wall portion 32.

In the following description, symbols in parentheses just indicate corresponding components in the embodiments described above. Those symbols intended to just show examples of components.

Feature A1

A case (10) in which a flow path (100) for a cooling fluid is formed, the case comprising:

a main body (20) including a supply port (111) through which the cooling fluid is supplied, a discharge port (131) through which the cooling fluid is discharged, and a recessed portion (30) recessed from a lower surface (23*b*) of a bottom portion (23) to an upper surface (23*a*) of the bottom portion in an arrangement direction in which the lower surface and the upper surface are arranged to define a portion of the flow path and to connect the supply port and the discharge port; and a cover (50) which has a main surface (50*a*) joined to the lower surface to cover the recessed portion except for the supply port and the discharge port and forms the flow path from the supply port and the discharge port, wherein the flow path includes:

a first flow path (110) which is connected to the supply port at one end;

a third flow path (130) which is arranged in parallel to the first flow path in a lateral direction where the supply port and the discharge port are arranged and is connected to the discharge port at one end; and a second flow path (120) extending back from the first flow path toward the third flow path and connecting the other end of the first flow path and the other end of the third flow path, wherein the bottom portion includes:

a central wall portion (35) which is surrounded by the flow path along a circumferential direction about the arrangement direction; and an outer peripheral wall portion (40) which surrounds the flow path in the circumferential direction, and wherein the central wall portion includes:

a first central wall portion (31) on a side of the supply port and the discharge port; and a second central wall portion (32) on a side of the second flow path, and wherein the maximum width in the lateral direction of the second central wall portion is greater than the maximum width in the lateral direction of the first central wall portion, and wherein the second center wall portion and the cover are joined in an annular manner along the second flow path.

Feature A2

The case according to the feature A1, wherein the first central wall portion and the cover are joined along the first flow path and the third flow path, and wherein an angle formed between a joining portion of the first central wall portion and the cover and the joining portion of the second central wall portion and the cover is an acute angle.

Feature A3

The case according to the feature A1 or A2, wherein the cover and the main body are joined by the friction stir welding method.

Feature A4

An electrical device which comprises electrical components (15, 16, 17) and a case (10) which accommodates the electrical components in an internal space (21) thereof, and a flow path (100) through which a cooling fluid flows is formed in the case, the electrical device comprising:

a main body (20) including a supply port (111) through which the cooling fluid is supplied, a discharge port (131) through which the cooling fluid is discharged, and a recessed portion (30) recessed from a lower surface (23*b*) of a bottom portion (23) to an upper surface (23*a*) of the bottom portion in an arrangement direction in which the lower surface and the upper surface are arranged to define a portion of the flow path and to connect the supply port and the discharge port; and a cover (50) which has a main surface (50*a*) joined to the lower surface to cover the recessed portion except for the supply port and the discharge port and forms the flow path from the supply port and the discharge port, wherein the flow path includes:

a first flow path (110) which is connected to the supply port at one end;

a third flow path (130) which is arranged in parallel to the first flow path in a lateral direction where the supply port and the discharge port are arranged and is connected to the discharge port at one end; and a second flow path (120) extending back from the first flow path toward the third flow path and connecting the other end of the first flow path and the other end of the third flow path;

the bottom portion includes:

a central wall portion (35) which is surrounded by the flow path along a circumferential direction about the arrangement direction; and an outer peripheral wall portion (40) which surrounds the flow path in the circumferential direction, and wherein the central wall portion includes:

a first central wall portion (31) on a side of the supply port and the discharge port; and a second central wall portion (32) on a side of the second flow path, and wherein the maximum width in the lateral direction of the second central wall portion is greater than the maximum width in the lateral direction of the first central wall portion, and wherein the second central wall portion and the cover are joined in an annular manner along the second flow path.

Feature A5

A method for manufacturing a case (10) in which a flow path (100) for a cooling fluid is formed, the case comprising:

a main body (20) including a supply port (111) through which the cooling fluid is supplied, a discharge port (131) through which the cooling fluid is discharged, and a recessed portion (30) recessed from a lower surface (23*b*) of a bottom portion (23) to an upper surface (23*a*) of the bottom portion in an arrangement direction in which the lower surface and the upper surface are arranged to define a portion of the flow path and to connect the supply port and the discharge port; and a cover (50) which has a main surface (50*a*) joined to the lower surface to cover the recessed portion except for the supply port and the discharge port and forms the flow path from the supply port and the discharge port, wherein the flow path includes:

a first flow path (110) which is connected to the supply port at one end;

a third flow path (130) which is arranged in parallel to the first flow path in a lateral direction where the supply port and the discharge port are arranged and is connected to the discharge port at one end; and a second flow path (120) extending back from the first flow path toward the third flow path and connecting the other end of the first flow path and the other end of the third flow path;

the bottom portion includes:

a central wall portion (35) which is surrounded by the flow path along a circumferential direction about the arrangement direction; and an outer peripheral wall portion (40) which surrounds the flow path in the circumferential direction, and wherein the central wall portion includes:

a first central wall portion (31) on a side of the supply port and the discharge port; and a second central wall portion (32) on a side of the second flow path, and wherein the maximum width in the lateral direction of the second central wall portion is greater than the maximum width in the lateral direction of the first central wall portion, and wherein the second central wall portion and a cover are joined in an annular manner along a second flow path, the method comprising:

preparing a tool which mechanically joins the cover and the main body using frictional heat by pressing the cover toward the bottom portion;

providing the cover on a lower surface of the bottom portion in such a manner that a main surface is arranged in parallel on the lower surface;

pressing the tool against on a portion where the cover and a portion of the second central wall portion on a side to the first central wall portion overlap in the arrangement direction; and joining the cover and the second central wall portion by moving the tool in an annular manner along an edge of the second central wall portion on a side of the second flow path.

Feature A6

A method for manufacturing an electrical device which comprises electrical components (15, 16, 17) and a case (10) which accommodates the electrical components in an internal space (21) thereof, and a flow path (100) through which a cooling fluid flows is formed in the case, the electrical device comprising:

a main body (20) including a supply port (111) through which the cooling fluid is supplied, a discharge port (131) through which the cooling fluid is discharged, and a recessed portion (30) recessed from a lower surface (23*b*) of a bottom portion (23) to an upper surface (23*a*) of the bottom portion in an arrangement direction in which the lower surface and the upper surface are arranged to define a portion of the flow path and to connect the supply port and the discharge port; and a cover (50) which has a main surface (50*a*) joined to the lower surface to cover the recessed portion except for the supply port and the discharge port and forms the flow path from the supply port and the discharge port, wherein the flow path includes:

a first flow path (110) which is connected to the supply port at one end;

a third flow path (130) which is arranged in parallel to the first flow path in a lateral direction where the supply port and the discharge port are arranged and is connected to the discharge port at one end; and a second flow path (120) extending back from the first flow path toward the third flow path and connecting the other end of the first flow path and the other end of the third flow path;

the bottom portion includes:

a central wall portion (35) which is surrounded by the flow path along a circumferential direction about the arrangement direction; and an outer peripheral wall portion (40) which surrounds the flow path in the circumferential direction, and wherein the central wall portion includes:

a first central wall portion (31) on a side of the supply port and the discharge port; and a second central wall portion (32) on a side of the second flow path, and wherein the maximum width in the lateral direction of the second central wall portion is greater than the maximum width in the lateral direction of the first central wall portion, and wherein the second central wall portion and a cover are joined in an annular manner along a second flow path, the method comprising:

preparing a tool which mechanically joins the cover and the main body using frictional heat by pressing the cover toward the bottom portion;

providing the cover on a lower surface of the bottom portion in such a manner that a main surface is arranged in parallel on the lower surface;

pressing the tool against on a portion where the cover and a portion of the second central wall portion on a side to the first central wall portion overlap in the arrangement direction; and joining the cover and the second central wall portion by moving the tool in an annular manner along an edge of the second central wall portion on a side of the second flow path.

What is claimed is:

1. A case in which a flow path for a cooling fluid is formed, the case comprising:

a main body including a supply port through which the cooling fluid is supplied, a discharge port through which the cooling fluid is discharged, and a recessed portion recessed from a lower surface of a bottom portion to an upper surface of the bottom portion in an arrangement direction in which the lower surface and the upper surface are arranged to define a portion of the flow path and to connect the supply port and the discharge port; and a cover which has a first main surface joined to the lower surface to cover the recessed portion except for the supply port and the discharge port and forms the flow path from the supply port and the discharge port, wherein the cover is formed with an extension portion which is placed on a portion to define a part of the flow path, protrudes from a second main surface, which is a back surface of the first main surface, to the first main surface in the arrangement direction, and extends along an extension direction of the flow path, and wherein the extension portion is defined by an outer edge portion which includes a part extending along the flow path and a part extending in a width direction perpendicular to the extension direction, and wherein the extension portion is divided into a plurality of portions, and wherein the flow path includes:

a first flow path which is connected to the supply port at one end;

a third flow path which is arranged parallel to the first flow path in a lateral direction in which the supply port and the discharge port are arranged in parallel and is connected to the discharge port at one end; and a second flow path which extends from the first flow path to the third flow path in a turning manner and connects the other end of the first flow path and the other end of the third flow path, wherein the bottom portion includes:

a central wall portion which is surrounded by the flow path along a circumferential direction about the arrangement direction; and an outer peripheral wall portion which surrounds the flow path in the circumferential direction, wherein the cover is joined to the lower surface to cover the central wall portion, the flow path, and a part of the outer peripheral wall portion, and wherein at least two of the ends of the extension portion divided into a plurality of portions are provided in the second flow path, and wherein the central wall portion includes:

a first central wall portion on a side of both the supply port and the discharge port; and a second central wall portion on a side of the second flow path, wherein the maximum width in the lateral direction of the second central wall portion is larger than the maximum width in the lateral direction of the first central wall portion, and wherein the second central wall portion and the cover are joined in an annular shape along the second flow path.

2. The case according to claim 1, wherein two parts of the outer edge portion provided in the second flow path are located to oppose each other in the extension direction.

3. The case according to claim 1, wherein a distance between two parts of the outer edge portion provided in the second flow path is smaller than an average width in the lateral direction of the central wall portion.

4. The case according to claim 1, wherein a distance between two parts of the outer edge portion provided in the second flow path is smaller than an average width in the width direction of the extension portion.

5. The case according to claim 1, further comprising:

a plurality of extension portions including the extension portion, wherein the plurality of extension portions are arranged in parallel in the width direction.

6. An electrical device comprises electrical components and a case which accommodates the electrical components in an internal space thereof, and a flow path through which a cooling fluid flows is formed in the case, the electrical device comprising:

the case includes:

a main body including a supply port through which the cooling fluid is supplied, a discharge port through which the cooling fluid is discharged, and a recessed portion recessed from a lower surface of a bottom portion to an upper surface of the bottom portion in an arrangement direction in which the lower surface and the upper surface are arranged to define a portion of the flow path and to connect the supply port and the discharge port; and a cover which has a first main surface joined to the lower surface to cover the recessed portion except for the supply port and the discharge port and forms the flow path from the supply port and the discharge port, wherein the cover is formed with an extension portion which is placed on a portion to define a part of the flow path, protrudes from a second main surface, which is a back surface of the first main surface, to the first main surface in the arrangement direction, and extends along an extension direction of the flow path, and wherein the extension portion is defined by an outer edge portion which includes a part extending along the flow path and a part extending in a width direction perpendicular to the extension direction, and wherein the extension portion is divided into a plurality of portions, and wherein the flow path includes:

a first flow path which is connected to the supply port at one end;

a third flow path which is arranged parallel to the first flow path in a lateral direction in which the supply port and the discharge port are arranged in parallel and is connected to the discharge port at one end; and a second flow path which extends from the first flow path to the third flow path in a turning manner and connects the other end of the first flow path and the other end of the third flow path, wherein the bottom portion includes:

a central wall portion which is surrounded by the flow path along a circumferential direction about the arrangement direction; and an outer peripheral wall portion which surrounds the flow path in the circumferential direction, wherein the cover is joined to the lower surface to cover the central wall portion, the flow path, and a part of the outer peripheral wall portion, and wherein at least two of the ends of the extension portion divided into a plurality of portions are provided in the second flow path, and wherein the central wall portion includes:

a first central wall portion on a side of both the supply port and the discharge port; and a second central wall portion on a side of the second flow path, wherein the maximum width in the lateral direction of the second central wall portion is larger than the maximum width in the lateral direction of the first central wall portion, and wherein the second central wall portion and the cover are joined in an annular shape along the second flow path.

7. The electrical device according to claim 6, wherein two parts of the outer edge portion provided in the second flow path are located to oppose each other in the extension direction.

8. The electrical device according to claim 6, wherein a distance between two parts of the outer edge portion provided in the second flow path is smaller than an average width in the lateral direction of the central wall portion.

9. The electrical device according to claim 6, wherein a distance between two parts of the outer edge portion provided in the second flow path is smaller than an average width in the width direction of the extension portion.

10. The electrical device according to claim 6, further comprising:

a plurality of extension portions including the extension portion, wherein the plurality of extension portions are arranged in parallel in the width direction.

* * * * *